US012653010B2

(12) United States Patent
Shao et al.

(10) Patent No.: US 12,653,010 B2
(45) Date of Patent: Jun. 9, 2026

(54) ADAPTIVE INTERCONNECT STRUCTURE FOR SEMICONDUCTOR PACKAGE

(71) Applicant: Taiwan Semiconductor Manufacturing Co., Ltd., Hsinchu (TW)

(72) Inventors: Tung-Liang Shao, Hsinchu (TW); Yu-Sheng Huang, Hemei Township (TW); Wen-Hao Cheng, Hsinchu (TW); Chen-Hua Yu, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 704 days.

(21) Appl. No.: 17/822,879

(22) Filed: Aug. 29, 2022

(65) Prior Publication Data

US 2024/0071965 A1 Feb. 29, 2024

(51) Int. Cl.
| | |
|---|---|
| *H10W 20/20* | (2026.01) |
| *H10W 70/05* | (2026.01) |
| *H10W 72/00* | (2026.01) |
| *H10W 74/10* | (2026.01) |
| *H10W 70/654* | (2026.01) |

(Continued)

(52) U.S. Cl.
CPC ........... *H10W 20/20* (2026.01); *H10W 70/05* (2026.01); *H10W 72/019* (2026.01); *H10W 74/117* (2026.01); *H10W 70/654* (2026.01); *H10W 70/66* (2026.01); *H10W 80/312* (2026.01); *H10W 80/327* (2026.01); *H10W 90/792* (2026.01)

(58) Field of Classification Search
CPC .. H01L 24/08; H01L 21/4857; H01L 23/3128
See application file for complete search history.

(56) References Cited

U.S. PATENT DOCUMENTS

| | | | |
|---|---|---|---|
| 8,993,380 B2 | 3/2015 | Hou et al. | |
| 9,000,584 B2 | 4/2015 | Lin et al. | |

(Continued)

FOREIGN PATENT DOCUMENTS

| | | |
|---|---|---|
| TW | 201926489 A | 7/2019 |
| TW | 202038396 A | 10/2020 |

(Continued)

*Primary Examiner* — Trang Q Tran
(74) *Attorney, Agent, or Firm* — Slater Matsil, LLP

(57) ABSTRACT

A package includes a first package component including a semiconductor die, wherein the semiconductor die includes conductive pads, wherein the semiconductor die is surrounded by an encapsulant; an adaptive interconnect structure on the semiconductor die, wherein the adaptive interconnect structure includes conductive lines, wherein each conductive line physically and electrically contacts a respective conductive pad; and first bond pads, wherein each first bond pad physically and electrically contacts a respective conductive line; and a second package component including an interconnect structure, wherein the interconnect structure includes second bond pads, wherein each second bond pad is directly bonded to a respective first bond pad, wherein each second bond pad is laterally offset from a corresponding conductive pad which is electrically coupled to that second bond pad.

20 Claims, 25 Drawing Sheets

(51) Int. Cl.

| | | |
|---|---|---|
| *H10W 70/66* | | (2026.01) |
| *H10W 80/00* | | (2026.01) |
| *H10W 90/00* | | (2026.01) |

(56) References Cited

U.S. PATENT DOCUMENTS

| | | | |
|---|---|---|---|
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,299,649 | B2 | 3/2016 | Chiu et al. |
| 9,368,460 | B2 | 6/2016 | Yu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,461,018 | B1 | 10/2016 | Tsai et al. |
| 9,496,189 | B2 | 11/2016 | Yu et al. |
| 9,666,502 | B2 | 5/2017 | Chen et al. |
| 9,735,131 | B2 | 8/2017 | Su et al. |
| 2015/0090950 | A1* | 4/2015 | Ha .......................... H10B 63/84 257/4 |
| 2019/0067104 | A1* | 2/2019 | Huang .................... H01L 24/16 |
| 2019/0164860 | A1 | 5/2019 | Lin et al. |
| 2021/0183745 | A1* | 6/2021 | Yu ........................ H01L 21/4846 |
| 2021/0391302 | A1* | 12/2021 | Kao .................. H01L 23/53228 |
| 2022/0189850 | A1* | 6/2022 | Liff ................... H01L 23/49816 |
| 2022/0262742 | A1 | 8/2022 | Hou et al. |
| 2022/0262768 | A1 | 8/2022 | Chen et al. |

FOREIGN PATENT DOCUMENTS

| | | |
|---|---|---|
| TW | 202232613 A | 8/2022 |
| TW | 202232679 A | 8/2022 |

* cited by examiner

ADAPTIVE INTERCONNECT STRUCTURE FOR SEMICONDUCTOR PACKAGE

BACKGROUND

The semiconductor industry has experienced rapid growth due to ongoing improvements in the integration density of a variety of electronic components (e.g., transistors, diodes, resistors, capacitors, etc.). For the most part, improvement in integration density has resulted from iterative reduction of minimum feature size, which allows more components to be integrated into a given area. As the demand for shrinking electronic devices has grown, a need for smaller and more creative packaging techniques of semiconductor dies has emerged.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
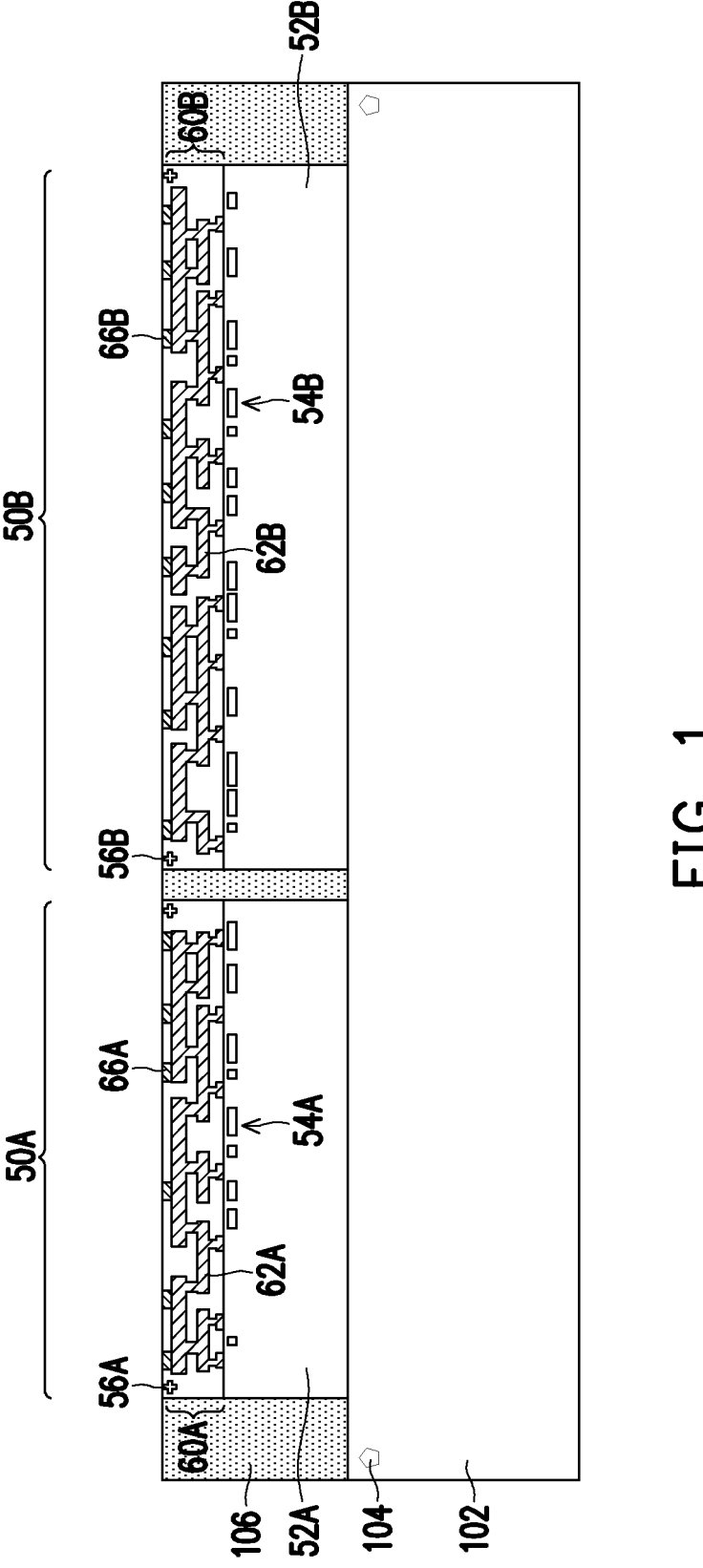
FIGS. 1 and 2 illustrate a cross-sectional view and a top-down view of an intermediate step in the formation of an integrated circuit component. In accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s)

as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In accordance with some embodiments, an interconnect structure is formed to compensate for any lateral offset of bond pads. The interconnect structure may include conductive lines that connect the offset bond pads to overlying "corrected" bond pads that have little or no offset. The interconnect structure may be formed using adaptive techniques, such as using programmable photolithography techniques. In this manner, the interconnect structure may be formed to provide more precise bonding between the corrected bond pads and an overlying component without requiring significant process changes or additional process steps.

FIG. 1 illustrates a cross-sectional view of integrated circuit dies 50 attached to a carrier 102, in accordance with some embodiments. FIG. 1 shows two integrated circuit dies 50A-B attached to the carrier 102, but in other embodiments only one integrated circuit die 50 or more than two integrated circuit dies 50 may be utilized. The integrated circuit dies 50A-B are packaged in subsequent processing to form an integrated circuit component 100 (see FIGS. 9-10) that is incorporated into a package 300 (see FIG. 15), in accordance with some embodiments. An integrated circuit die 50 (e.g., 50A and/or 50B) may comprise a logic die (e.g., central processing unit (CPU), graphics processing unit (GPU), system-on-a-chip (SoC), application processor (AP), micro-controller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) die), the like, or combinations thereof. The integrated circuit dies 50 of a integrated circuit component 100 may include similar types of dies or different types of dies.

An integrated circuit die 50 may be formed in a wafer, which may include different device regions that are singulated in subsequent steps to form a plurality of integrated circuit dies. An integrated circuit die 50 may be processed according to applicable manufacturing processes to form integrated circuits. An integrated circuit die 50 may include a semiconductor substrate 52, examples of which are shown in FIG. 1 by semiconductor substrates 52A and 52B. For example, as shown in FIG. 1, the integrated circuit die 50A includes a semiconductor substrate 52A and the integrated circuit die 50B includes a semiconductor substrate 52B. A semiconductor substrate 52 (e.g., the semiconductor substrate 52A and/or the semiconductor substrate 52B) may be silicon, doped or undoped, or an active layer of a semiconductor-on-insulator (SOI) substrate. A semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. A semiconductor substrate 52 may have an active surface (e.g., the surface facing upwards in FIG. 1), sometimes called a front side or a top side, and an inactive surface (e.g., the surface facing downwards in FIG. 1), sometimes called a back side.

Devices 54 may be formed at the front surface of a semiconductor substrate 52, examples of which are shown in FIG. 1 by devices 54A and devices 54B. For example, the integrated circuit die 50A includes devices 54A, and the integrated circuit die 50B includes devices 54B. The devices 54 (e.g., the devices 54A and/or the devices 54B) may include active devices (e.g., transistors, diodes, etc.), capacitors, resistors, etc. An inter-layer dielectric (ILD) may surround and cover the devices 54 (not illustrated). An integrated circuit die 50 may include an interconnect structure 60 that interconnects the devices 54 to form an integrated circuit. For example, the integrated circuit die 50A includes an interconnect structure 60A, and the integrated circuit die 50B includes an interconnect structure 60B. The interconnect structure 60 may be formed by, for example, metallization patterns in dielectric layers (e.g., inter-metal dielectric (IMD) layers or the like). The metallization patterns may be redistribution layers, and may include metal lines and vias formed in one or more low-k dielectric layers, in some embodiments. The metallization patterns of the interconnect structure 60 are electrically coupled to the devices 54.

In some embodiments, the interconnect structure 60 includes pads 66 at or near the top of the interconnect structure 60, which may be exposed. For example, the interconnect structure 60A of the integrated circuit die 50A includes pads 66A and the interconnect structure 60B of the integrated circuit die 50B includes pads 66B. The pads 66 are electrically coupled to the metallization patterns of the interconnect structure 60, and may be part of a metallization pattern (e.g., the topmost metallization pattern) of the interconnect structure 60, in some embodiments. In some embodiments, an interconnect structure 60 may include alignment marks 56 used during placement of the integrated circuit die 50 or during subsequent processing. For example, the interconnect structure 60A may include alignment marks 56A and the interconnect structure 60B may include alignment marks 56B. The interconnect structures 60A-B are examples, and interconnect structures 60 having other configurations or dimensions are possible.

The integrated circuit dies 50A-B may be attached to a carrier 102, in some embodiments. The carrier 102 may be a glass carrier substrate, a ceramic carrier substrate, or the like. The carrier 102 may be a wafer, such that multiple packages can be formed on the carrier 102 simultaneously. In some embodiments, the carrier 102 includes alignment marks 104. The integrated circuit dies 50A-B may be attached to the carrier 102 with an adhesive (not illustrated) and may be placed using a pick-and-place method or the like. The alignment marks 104 of the carrier, the alignment marks 56A of the integrated circuit die 50A, and/or the alignment marks 56B of the integrated circuit die 50B may be utilized during placement of the integrated circuit dies 50A-B, in some cases. In some embodiments, the carrier 102 is subsequently removed from the integrated circuit dies 50A-B, and in such embodiments, the integrated circuit dies 50A-B are attached using a release layer or the like. In some embodiments, the carrier 102 is not subsequently removed from the integrated circuit dies 50A-B and is incorporated into the package 300 (see FIG. 15). In such embodiments, the carrier 102 may comprises a heat sink or another thermally dissipating structures.

After attaching the integrated circuit dies 50A-B, an encapsulant 106 may be is formed on and around the integrated circuit dies 50A-B, in some embodiments. The encapsulant 106 encapsulates the integrated circuit dies 50A-B. The encapsulant 106 may be a molding compound, epoxy, or the like. The encapsulant 106 may be applied by compression molding, transfer molding, or the like, and may be formed over the carrier 102 such that the integrated circuit dies 50A-B are buried or covered. The encapsulant 106 is further formed in gap regions between the integrated circuit dies 50. The encapsulant 106 may be applied in liquid or semi-liquid form and then subsequently cured. In some embodiments, after forming the encapsulant 106, a planarization process (e.g., a chemical-mechanical polish (CMP) process, a grinding process, an etching process, and/or the like) may be performed. In some embodiments, the pads 66A of the integrated circuit die 50A and the pads 66B of the integrated circuit die 50B are exposed after performing the planarization process. After performing the planarization process, top surfaces of the encapsulant 106 and the integrated circuit dies 50A-B may be level.

Figure 2:
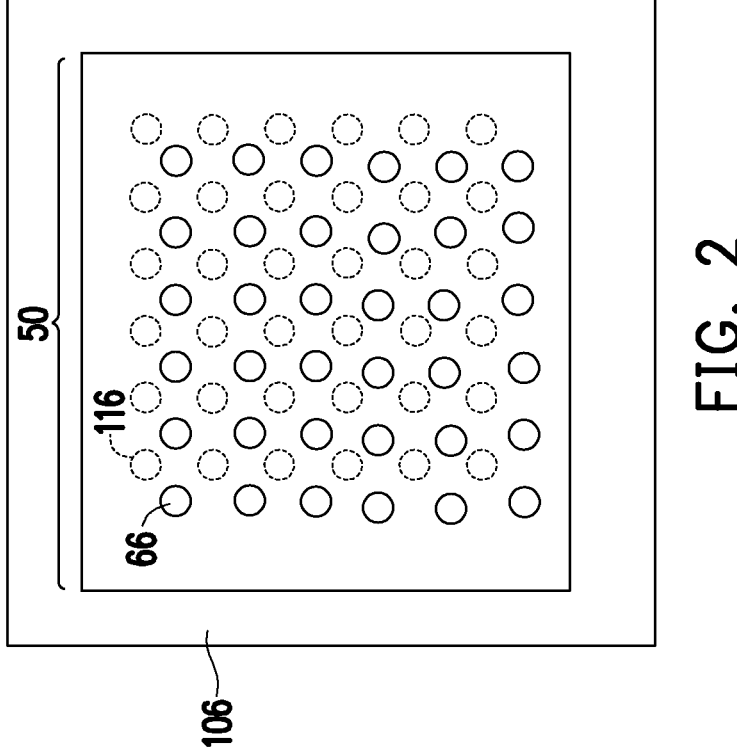

FIG. 2 illustrates a top-down view (e.g., a plan view) of an integrated circuit die 50, in accordance with some embodiments. FIG. 2 also illustrates a portion of the encapsulant 106 that surrounds the integrated circuit die 50. The integrated circuit die 50 shown in FIG. 2 is an illustrative example, and may be similar to one or both of the integrated circuit dies 50A-B, in some cases. As shown in FIG. 2, the integrated circuit die 50 includes exposed pads 66. However, in some cases, the pads 66 may be laterally offset from corresponding pads to which they are subsequently bonded. For example, the pads 66 may be laterally offset from corresponding bond pads 212 of a second package component 200, described in greater detail below for FIGS. 11-12. The lateral offset may be such that bonding the pads 66 to the corresponding bond pads 212 would result in poor or incomplete electrical coupling between the pads 212 and the bond pads 212. The lateral offset of the pads 66 may be due to misalignment, process variations, or the like, or may be intentional. The locations of the pads 66 without lateral offset are indicated in FIG. 2 by corrected pads 116. The locations of the corrected pads 116 correspond to the proper locations to be subsequently bonded to corresponding bond pads 212, for example. In other words, the corrected pads 116 have little or no lateral offset. The locations, number, and arrangement of the pads 66 and the corrected pads 116 are an illustrated example, and may be different in other embodiments.

FIGS. 3 through 10 illustrate the formation of an adaptive interconnect structure 120 (see FIG. 9), in accordance with some embodiments. The adaptive interconnect structure 120 may be formed, for example, to correct any lateral offset of the pads 66 relative to the subsequently-bonded bond pads 212. In some embodiments, the adaptive interconnect structure 120 includes corrected pads 116 (see FIGS. 9-10) that are electrically coupled to corresponding pads 66. The corrected pads 116 may be formed in locations that have less lateral offset than the pads 66, and thus the corrected pads 116 may allow for better quality bonding and better electrical coupling to the bond pads 212 than the uncorrected pads 66. The process described in FIGS. 3-10 is an example, and other processes for forming an adaptive interconnect structure are possible. For example, the adaptive interconnect structure 120 may be formed using any suitable techniques such as damascene, dual damascene, or the like.

Figure 3:
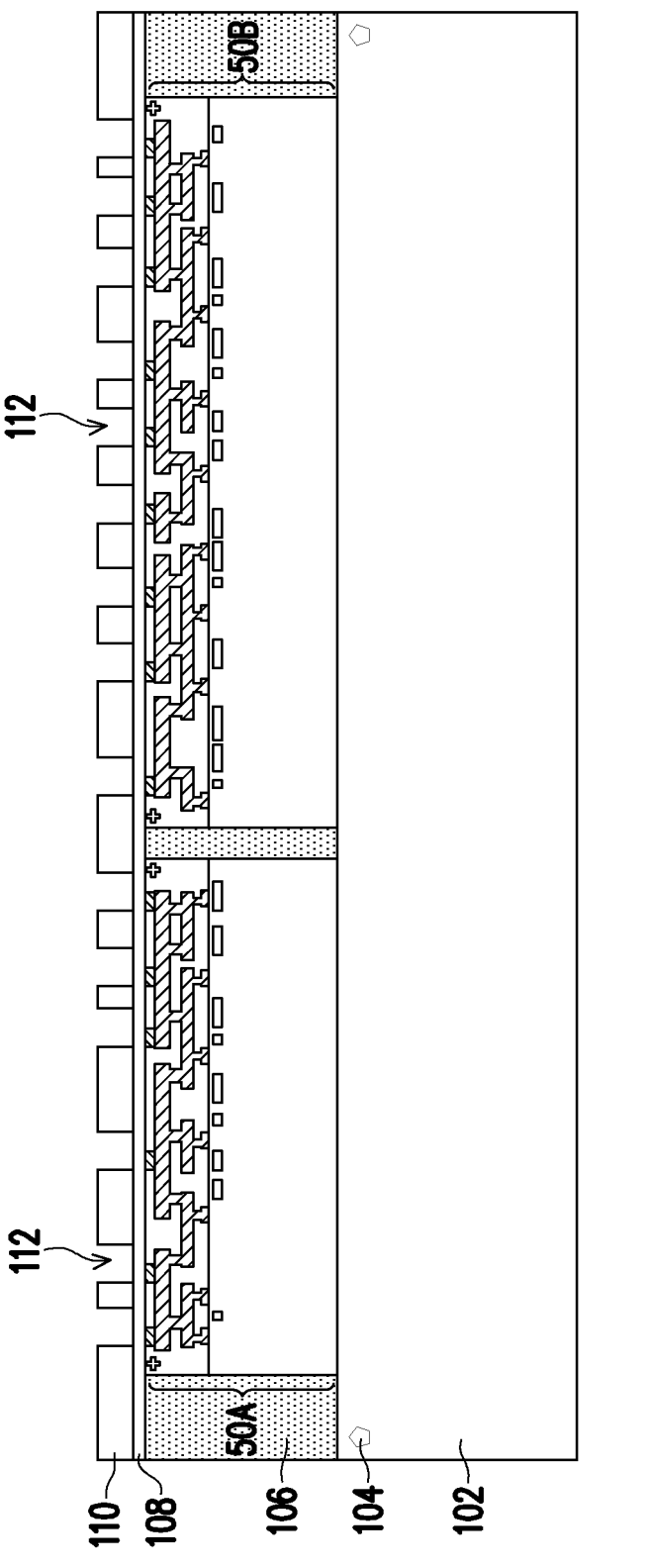
FIGS. 3, 4, 5, 6, 7, 8, 9, and 10 illustrate cross-sectional views and top-down views of intermediate steps in the formation of an adaptive interconnect structure, in accordance with some embodiments.

In FIG. 3, a first dielectric layer 108 and a patterned photoresist 110 is formed, in accordance with some embodiments. The first dielectric layer 108 may cover top surfaces of the encapsulant 106 and the integrated circuit dies 50A-B. In some embodiments, the first dielectric layer 108 is formed of a material such as silicon nitride, silicon oxide, silicon oxynitride, silicon oxycarbide, a glass, a polymer, the like, or a combination thereof. The first dielectric layer 108 may be formed by any acceptable deposition process, such as spin coating, CVD, laminating, the like, or a combination thereof. In some embodiments, the first dielectric layer 108 may be formed having a thickness in the range of about 0.07 μm to about 1 μm, though other thicknesses are possible. A photoresist 110 is then formed on the first dielectric layer 108, in accordance with some embodiments. The photoresist 110 may be a single layer or may be a photoresist structure formed of multiple layers. The photoresist 110 may be formed using suitable techniques, such as spin coating or the like.

Openings 112 may then be patterned in the photoresist 110, in accordance with some embodiments. The openings 112 correspond to the subsequently formed adaptive lines 114 (see FIGS. 7-8) that electrically couple the pads 66 to the subsequently formed corrected pads 116. In some embodiments, the pattern of the openings 112 is determined prior to patterning the photoresist 110. For example, the pattern corresponding to the openings 112 may be based on the locations of the pads 66 and the locations of the associated corrected pads 116. After determining the pattern of the openings 112, the photoresist 110 may then be adaptively patterned to form the openings 112. For example, the photoresist 110 may be adaptively patterned using a programmable lithography tool or the like that allows selective exposure of a photoresist 110 by controlling the light according to a predetermined pattern rather than by using, for example, using a photomask or the like. The programmable lithography tool may be, for example, a laser-writing system, an electron beam-writing system, a maskless exposure system, or the like. Other programmable lithography tools or adaptive patterning techniques are possible. By using a programmable lithography tool, the lateral offsets of each manufactured structure may be compensated for without requiring the creation of additional photomasks. This can improve process flexibility and also allow for changes to the arrangement of pads 66 (e.g., by changing to a different integrated circuit die) or bonding pads 212 without significant changes to the manufacturing process.

In some embodiments, a pattern may be determined and then used for multiple subsequent process runs. In some embodiments, the pattern of the openings 112 may be determined based on historical data related to the manufacturing process. For example, if it has been observed that a particular lateral offset occurs frequently or consistently over multiple process runs, the pattern may be determined to compensate for this predictable offset. As another example, a different integrated circuit die having a different arrangement of pads 66 may be used in the structure, with the pattern determined based on the different arrangement of pads 66.

In other embodiments, a separate pattern may be determined for each process run. In this manner, a pattern may be determined that more accurately corresponds to the lateral offsets of the pads 66. For example, the locations of the pads 66 may be observed or measured, and then pattern may be determined based on these observations or measurements. In some embodiments, the locations of the alignment marks 104, 56A, or 56B may be observed or measured and the pattern determined based on the locations or relative locations of the alignment marks 104, 56A, or 56B. In some embodiments, the locations of the corresponding bond pads 212 may be observed or measured instead of or in addition to the locations of the pads 66. In this manner, the pattern may be determined based at least partly on the locations of the bond pads 212.

Figure 4:
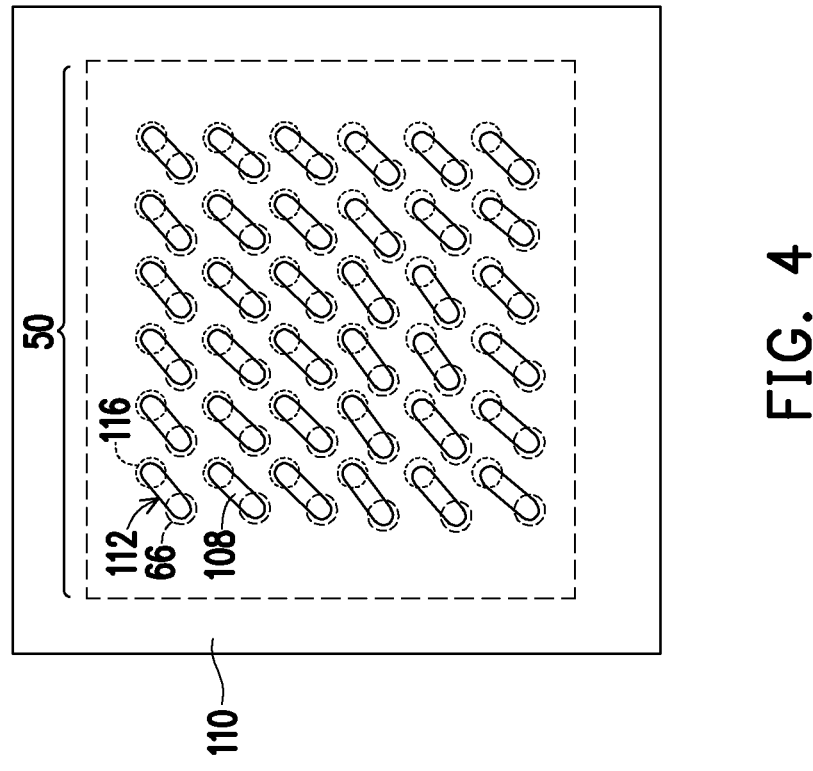

FIG. 4 illustrates a top-down view of an integrated circuit die 50 after formation of the patterned photoresist 110, in accordance with some embodiments. As shown in FIG. 4, each opening 112 may extend from a pad 66 to a corresponding corrected pad 116. The openings 112 may partially or fully overlap the pads 66 and/or the corrected pads 116. The openings 112 may have a width that is less than, greater than, or about the same as the width of the pads 66 or a width of the corrected pads 116. The openings 112 may have different lengths and/or widths, in some embodiments. The length, width, orientation, and/or arrangement of the openings 112 may depend on the relative positions of the pads 66 and the corrected pads 116.

Figure 5:
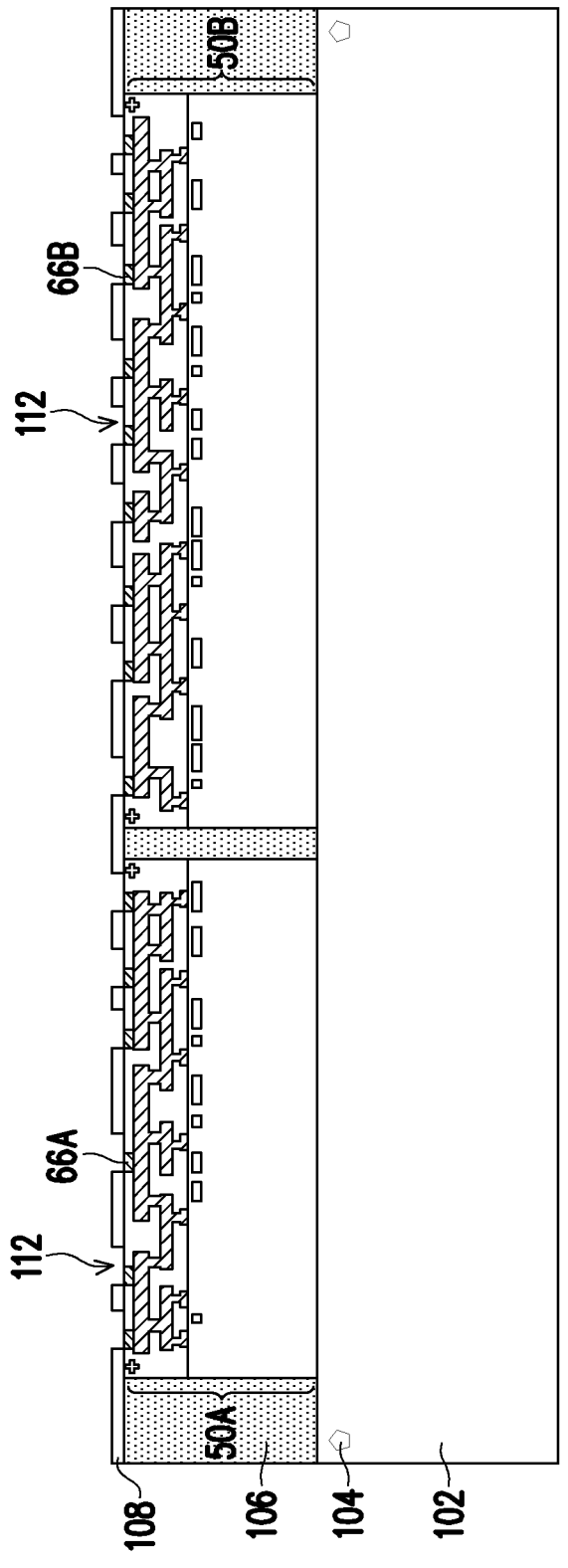

In FIG. 5, the openings 112 are extended through the first dielectric layer 108, in accordance with some embodiments. The openings 112 may be extended through the first dielectric layer 108 by etching the first dielectric layer 108 using the patterned photoresist 110 as an etching mask, in accordance with some embodiments. For example, a suitable wet etching process and/or dry etching process may be used. After forming openings 112 in the first dielectric layer 108, the photoresist 110 may be removed using a suitable process, such as an ashing process or the like.

Figure 6:
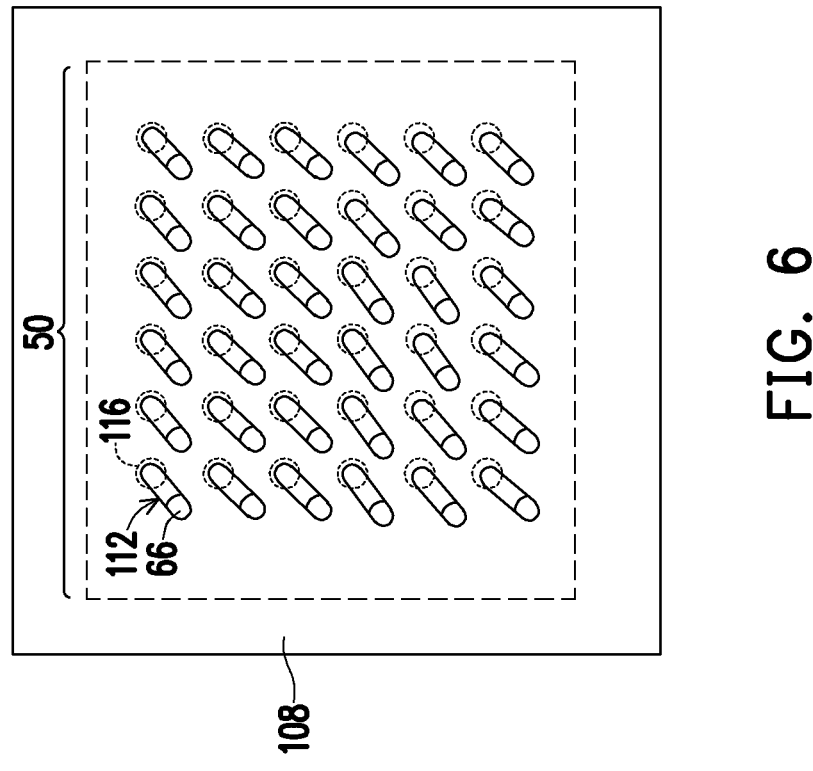

FIG. 6 illustrates a top down view of an integrated circuit die, in accordance with some embodiments. As shown in FIG. 6, the openings 112 in the first dielectric layer 108 at least partially expose the pads 66. In other embodiments, the openings 112 fully expose the pads 66.

Figure 7:
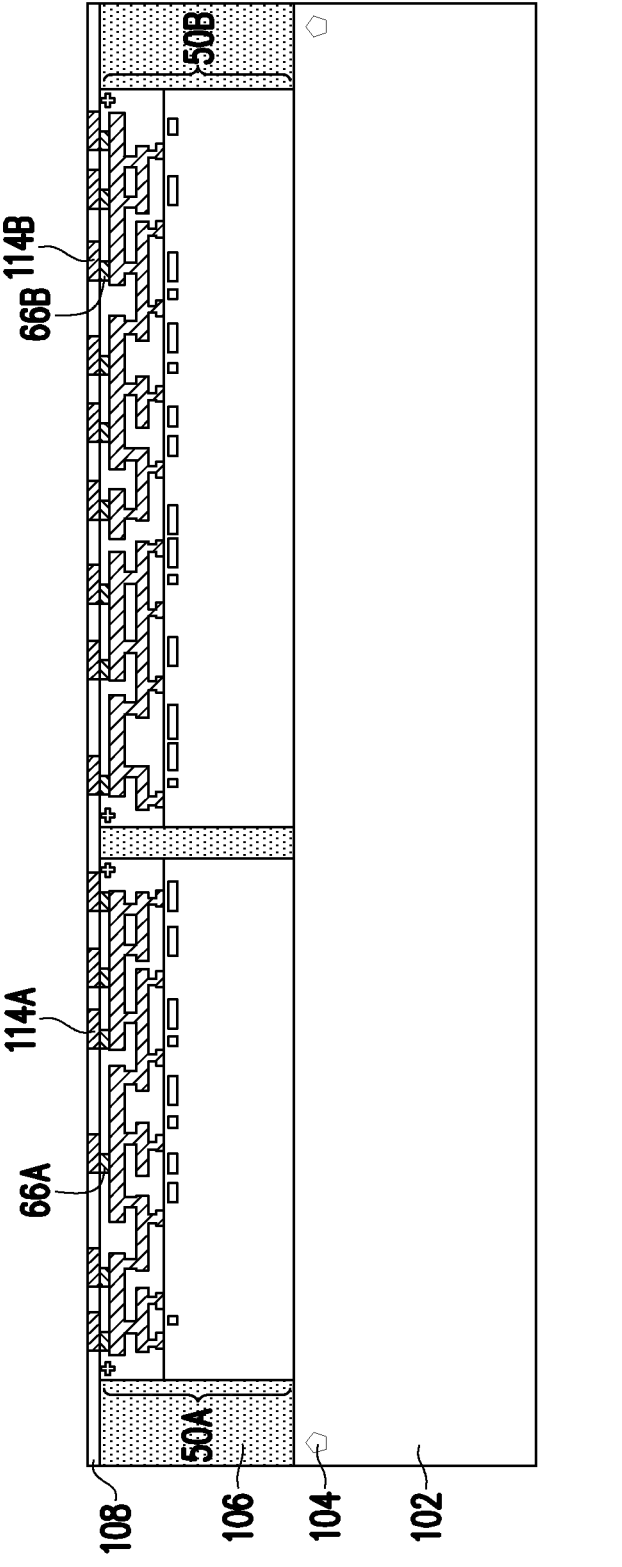

In FIG. 7, adaptive lines 114 are formed in the openings 112, in accordance with some embodiments. Once the pads 66 have been exposed by the openings 112, the adaptive lines 114 may be formed to make physical and electrical contact with the pads 66. As shown in FIG. 7, the adaptive lines 114A make physical and electrical contact with the pads 66A of the integrated circuit die 50A, and the adaptive lines 114A make physical and electrical contact with the pads 66A of the integrated circuit die 50A. In an embodiment, the adaptive lines 114 comprise a barrier layer, a seed layer, a fill metal, or a combination thereof. For example, the barrier layer may first be blanket deposited over the first dielectric layer 108 and within the openings 112. The barrier layer may comprise titanium, titanium nitride, tantalum, tantalum nitride, the like, or a combination thereof. The seed layer may be a conductive material such as copper and may be blanket deposited over the barrier layer using a suitable process, such as sputtering, evaporation, plasma-enhanced chemical vapor deposition (PECVD), or the like. The fill metal may be a conductive material such as copper or a copper alloy and may be deposited using a suitable process, such as electroplating, electroless plating, or the like. The fill metal may fill or overfill the openings 112, in some embodiments. Once the fill metal has been deposited, excess material of the fill metal, the seed layer, and the barrier layer may be removed using, for example, a planarization process such as a CMP process or the like After the planarization process, top surfaces of the first dielectric layer 108 and the adaptive lines 114 may be substantially level or coplanar, in some cases. Other materials or techniques are possible.

Figure 8:
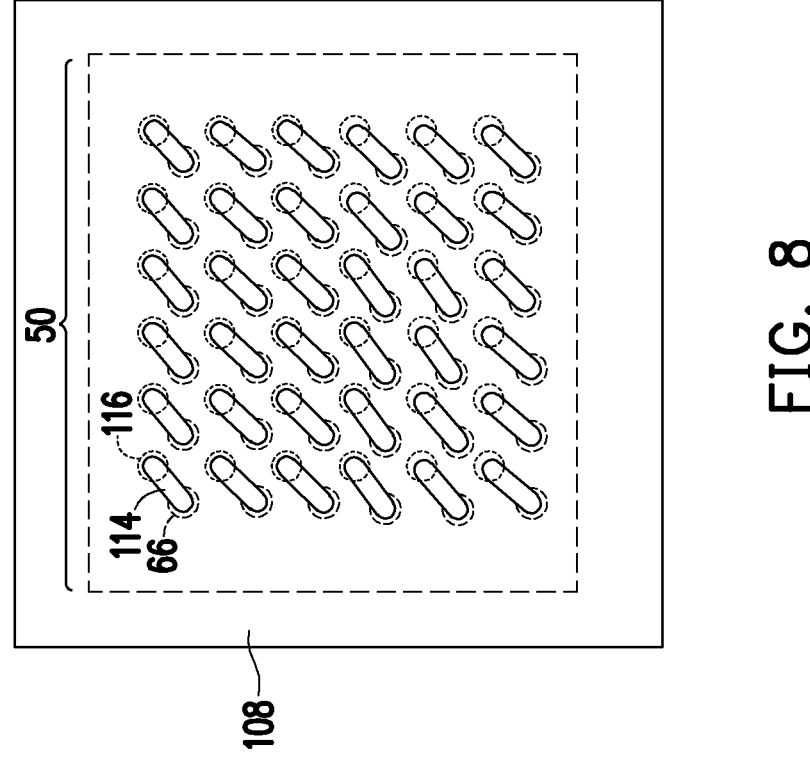

FIG. 8 illustrates a top-down view of an integrated circuit die 50 after formation of the adaptive lines 114, in accordance with some embodiments. The adaptive lines 114 may have a width that is less than, greater than, or about the same as the width of the pads 66 or a width of the corrected pads 116. The adaptive lines 114 may have different lengths and/or widths, in some embodiments. The length, width, orientation, and/or arrangement of the adaptive lines 114 may depend on the relative positions of the pads 66 and the corrected pads 116. In some embodiments, the adaptive lines 114 may have a width in the range of about 0.032 μm to about 1 μm or a length in the range of about 0.01 μm to about 1 μm, though other widths or lengths are possible.

Figure 9:
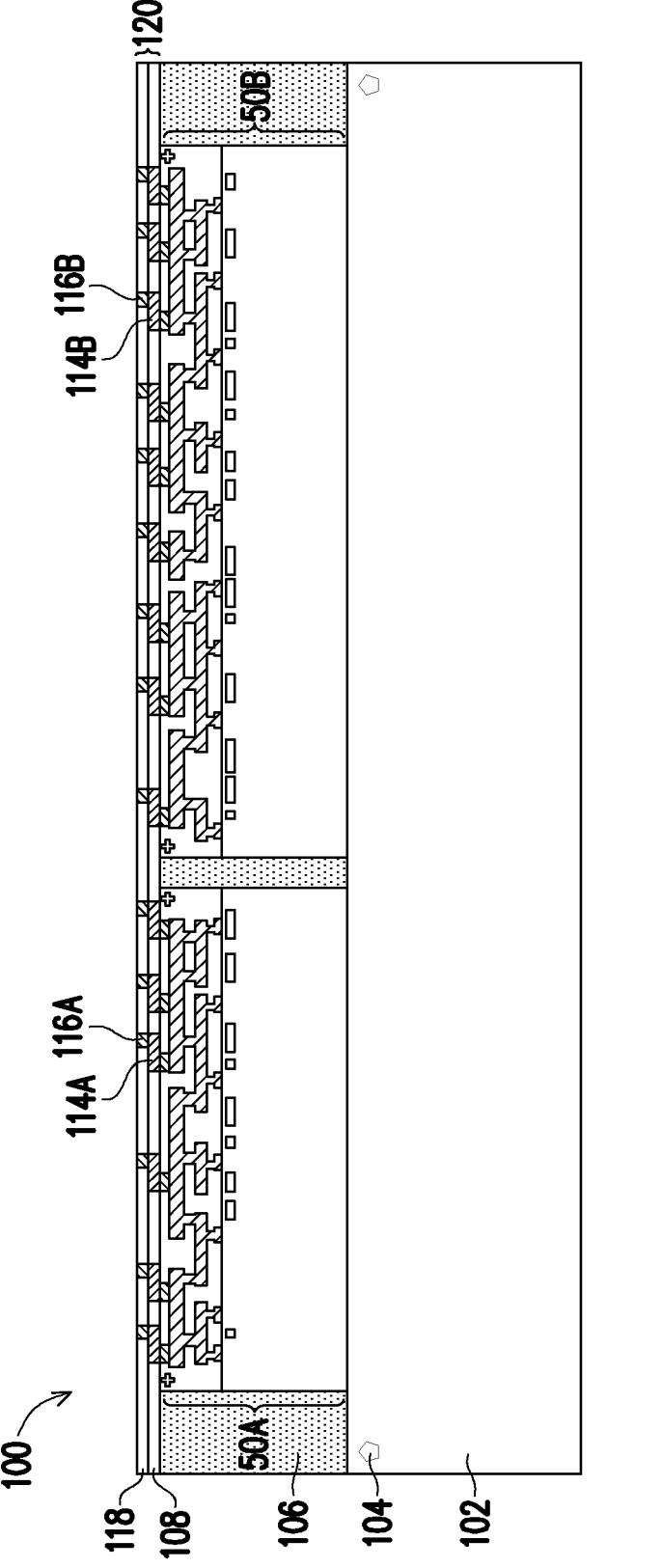

In FIG. 9, corrected pads 116 are formed on the adaptive lines 114, in accordance with some embodiments. In this manner, an adaptive interconnect structure 120 may be formed on the integrated circuit dies 50A-B, forming an integrated circuit component 100, in accordance with some embodiments. In some embodiments, a second dielectric layer 118 may be deposited over the first dielectric layer 108 and the adaptive lines 114. The second dielectric layer 118 may be formed using materials or techniques similar to those described previously for the first dielectric layer 108. In some embodiments, the material of the second dielectric layer 118 is chosen to allow bonding to other structures (e.g., the second package component 200, described below for FIG. 11). For example, the second dielectric layer 118 may be used for a bonding process such as direct bonding, fusion bonding, dielectric-to-dielectric bonding, oxide-to-oxide bonding, or the like. In accordance with some embodiments, the second dielectric layer 118 is formed of a silicon-containing dielectric material such as silicon oxide, silicon nitride, or the like. The second dielectric layer 118 may be deposited using any suitable technique. The second dielectric layer 118 may be deposited to a thickness in the range of about 70 nm to about 1000 nm. However, any suitable material, process, or thickness may be utilized.

The corrected pads 116 physically and electrically contact the adaptive lines 114. For example, in FIG. 9, a corrected pad 116A contacts the adaptive line 114A, and a corrected pad 116B contacts the adaptive line 114B. In some embodiments, the corrected pads 116 may be used for a bonding process such as direct bonding, fusion bonding, metal-to-metal bonding, or the like. The corrected pads 116 may be formed using techniques similar to those described previously for the adaptive lines 114, in some embodiments. For example, a photoresist (not illustrated) may be formed on the second dielectric layer 118 and patterned, with the pattern having openings (not separately illustrated) corresponding to the corrected pads 116. In some embodiments, the photoresist may be adaptively patterned using a programmable lithography tool. The openings may be extended into the second dielectric layer 118 by performing a suitable etching process using the patterned photoresist as an etching mask. Conductive material may then be deposited over the second dielectric layer 118 and in the openings to form the corrected pads 116. The conductive material may be similar to the conductive material of the adaptive lines 114, and may be formed using similar techniques. For example, the conductive material may comprise a barrier layer, a seed layer, a fill metal, or a combination thereof. A planarization process may be performed to remove excess conductive material. After performing the planarization process, top surfaces of the second dielectric layer 118 and the corrected pads 116 may be substantially level or coplanar, in some cases. Other materials or techniques are possible.

Figure 10:
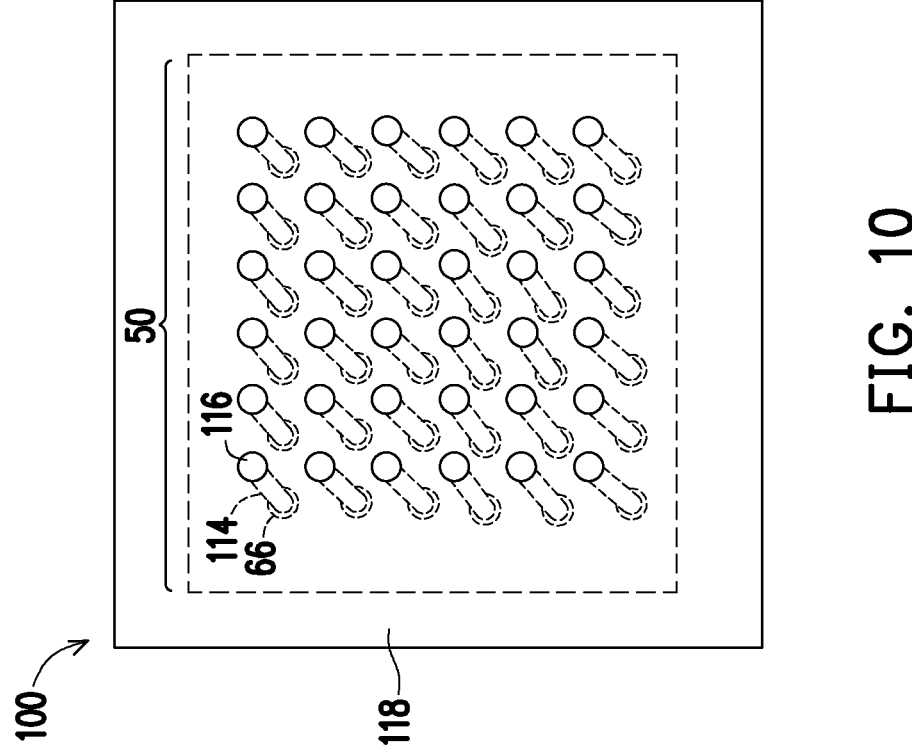

FIG. 10 illustrates a top-down view of an integrated circuit component 100 after formation of the corrected pads 116, in accordance with some embodiments. The top-down view is similar to that of FIGS. 2, 4, 6, and 8. The corrected pads 116 may have a width that is smaller than, about the same as, or greater than a width of the pads 66.

Figure 11:
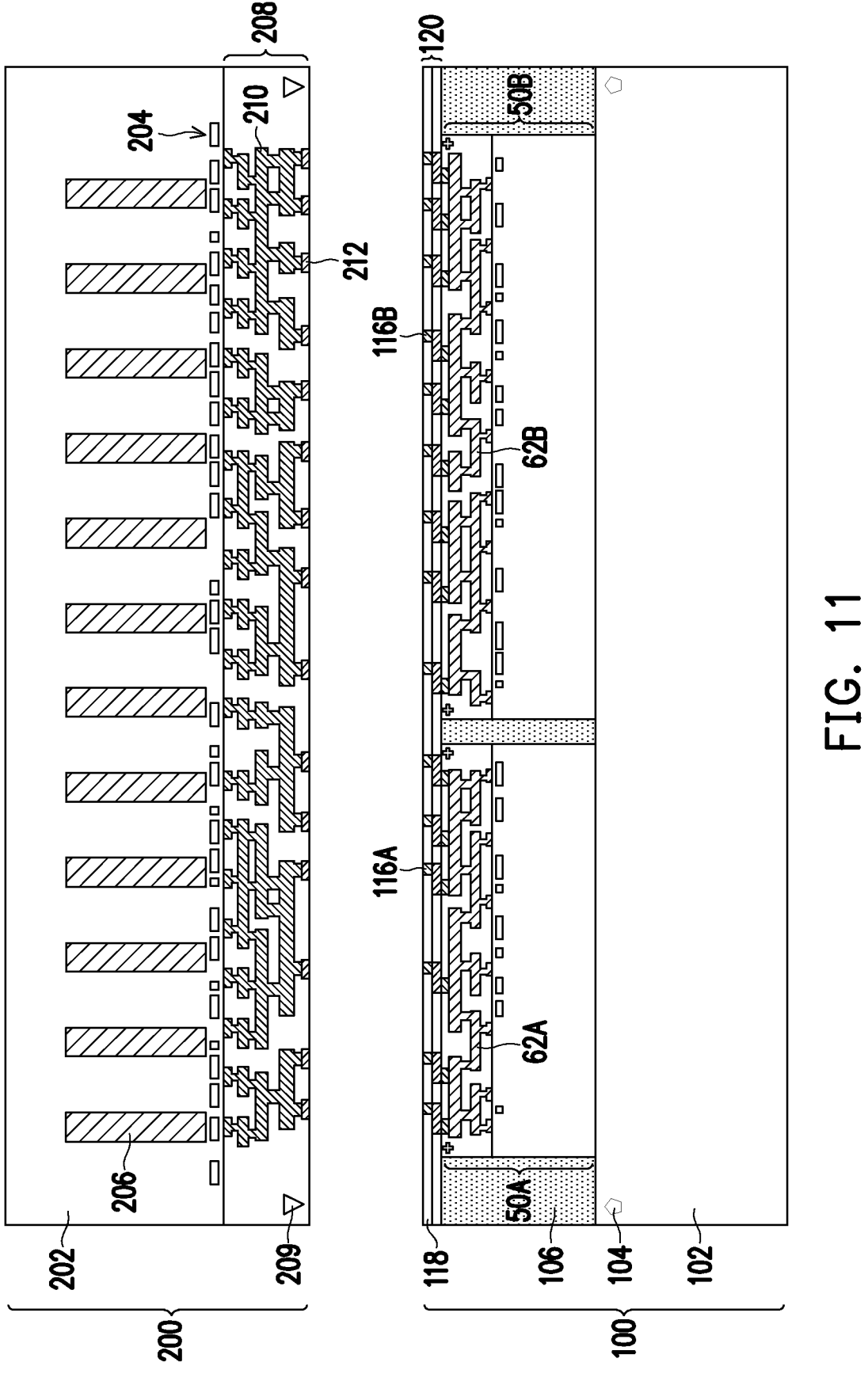
FIGS. 11, 12, 13, 14, and 15 illustrate cross-sectional views and top-down views of intermediate steps in the formation of a package, in accordance with some embodiments.

FIG. 11 illustrates an integrated circuit component 100 and a second package component 200 and prior to bonding, in accordance with some embodiments. The integrated circuit component 100 and the second package component 200 are subsequently bonded to form a package 300 (see FIG. 15). The second package component 200 shown in FIG. 11 is an example, and other types of components or structures, interposers, wafers, dies, devices, or the like may be bonded to the integrated circuit component 100 in other embodiments. The second package component 200 may include a substrate 202 and an interconnect structure 208 formed thereon, in some embodiments.

In some embodiments, the substrate 202 includes a semiconductor substrate (e.g., a wafer or the like), such as silicon, doped or undoped, or an active layer of a semiconductor-on-insulator (SOI) substrate. The substrate 202 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. In some embodiments, the substrate 202 has an active surface (e.g., the surface facing downwards in FIG. 11), sometimes called a front side or a "top side", and an inactive surface (e.g., the surface facing upwards in FIG. 11), sometimes called a back side.

In some embodiments, circuit devices 204 may be formed at the front surface of the substrate 202. The circuit devices 204 comprise a wide variety of active devices (e.g., transistors, diodes, or the like) and passive devices (e.g., capacitors, resistors, inductors, or the like) that may be used to generate the desired structural and functional requirements of the design for the package 300. The circuit devices may be formed using any suitable methods. In other embodiments, the substrate 202 is free of active and/or passive devices.

The interconnect structure 208 may be formed over the substrate 202 to interconnect the various circuit devices and/or the through-substrate vias 206 (described below.) The interconnect structure 208 may be similar to the interconnect structure 60 of an integrated circuit die 50, in some embodiments. In some embodiments, the interconnect structure 208 may include metallization layers formed of alternating layers of dielectric materials (e.g., low-k dielectric materials or the like) and conductive materials (e.g. metallization patterns, redistribution layers, or the like). The metallization layers may be formed using any suitable process, such as deposition, damascene, dual damascene, or the like. In some embodiments, an interconnect structure 208 may include alignment marks 209 used during bonding of the second package component 200 to the integrated circuit component 100. The interconnect structure 208 shown in FIG. 11 is an example, and interconnect structures 208 having other configurations are possible.

In some embodiments, the interconnect structure 208 includes bond pads 212 at or near the top of the interconnect structure 208, which may be exposed. The bond pads 212 are electrically coupled to the metallization layers of the interconnect structure 208, and may be part of a metallization pattern (e.g., the topmost metallization pattern) of the interconnect structure 208, in some embodiments. In some embodiments, the bond pads 212 are subsequently bonded to the corrected pads 116 to physically and electrically connect the integrated circuit component 100 to the second package component 200. For example, the bond pads 212 may be used for a bonding process such as direct bonding, fusion bonding, metal-to-metal bonding, or the like. The bond pads 212 may comprise materials similar to that of the corrected pads 116, though other materials are possible.

In some embodiments, the topmost dielectric layer of interconnect structure 208 is a material chosen to allow bonding of this topmost dielectric layer to the second dielectric layer 118 of the integrated circuit component 100. For example, the topmost dielectric layer of the interconnect structure 208 may be used for a bonding process such as direct bonding, fusion bonding, dielectric-to-dielectric bonding, oxide-to-oxide bonding, or the like. For example, the topmost dielectric layer of the interconnect structure 208 may be formed of a silicon-containing dielectric material such as silicon oxide, silicon nitride, a material similar to that of the second dielectric layer 118, or the like. The bond pads 212 may be formed in the topmost dielectric layer of the interconnect structure 208, in some cases.

In some embodiments, through-substrate vias (TSVs) 206 are formed within the substrate 202. The TSVs 206 may be formed within the substrate 202 and, if desired, within one or more layers of the interconnect structure 208. The TSVs 111 may be formed in order to provide electrical connectivity from a front side of the substrate 202 to a back side of substrate 202. In an embodiment, the TSVs 206 may be formed by initially forming TSV openings (not separately illustrated) into the substrate 202 and, if desired, any of the overlying metallization layers of the interconnect structure 208. The openings may then be filled with a conductive material, such as copper or the like. Excess conductive material may then be removed using, for example, a planarization process. In some embodiments, a liner and/or a barrier layer may be deposited in the openings before depositing the conductive material.

Figure 12:
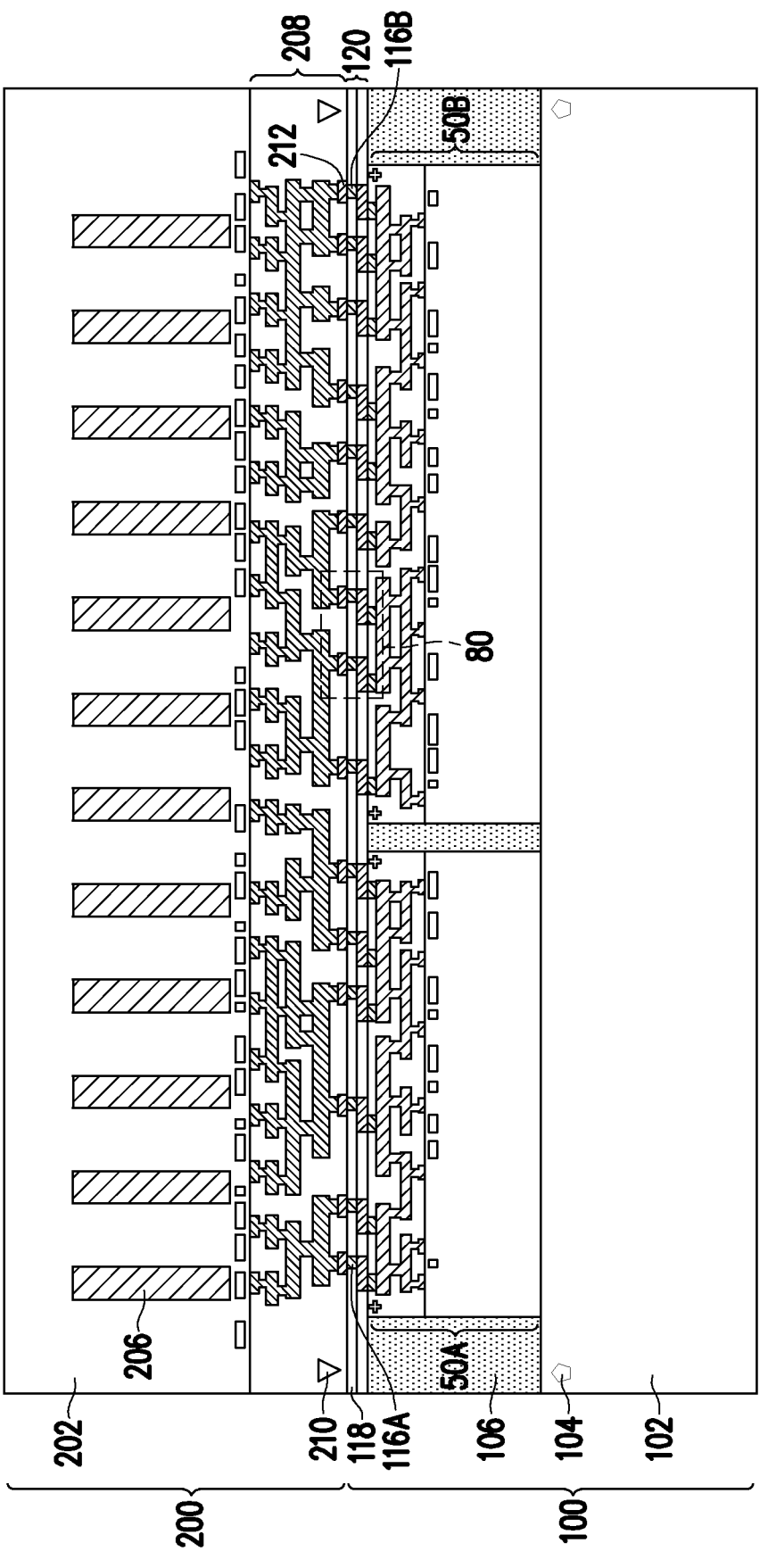
Figure 13:
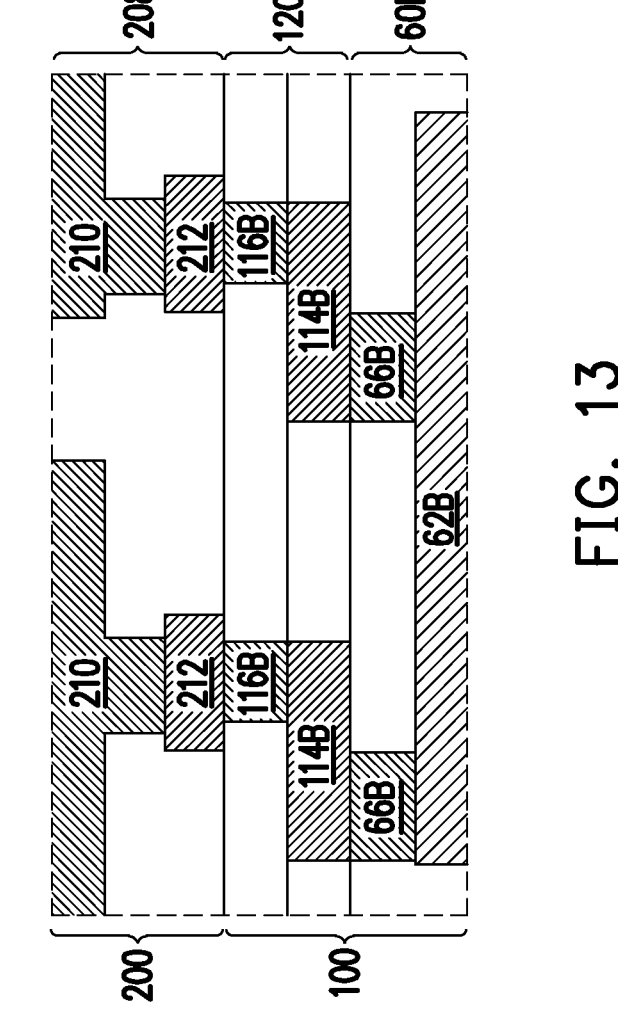

In FIG. 12, the integrated circuit component 100 and the second package component 200 are bonded together, in accordance with some embodiments. FIG. 13 illustrates a magnified view of the region 80 indicated in FIG. 12. In some embodiments, the integrated circuit component 100 is bonded to the second package component 200 using, for example, dielectric-to-dielectric bonding, metal-to-metal bonding, or a combination thereof (e.g., "hybrid bonding"). In some embodiments, the bonding surfaces of the integrated circuit component 100 and/or the bonding surfaces of the second package component 200 may be activated prior to bonding. Activating the bonding surfaces may comprise a dry treatment, a wet treatment, a plasma treatment, exposure to an inert gas plasma, exposure to $H_2$, exposure to $N_2$, exposure to $O_2$, the like, or combinations thereof. For embodiments in which a wet treatment is used, an RCA cleaning may be used, in some embodiments. In other embodiments, the activation process may comprise other types of treatments. The activation process facilitates bonding of the integrated circuit component 100 and the second package component 200.

After the activation process, the integrated circuit component 100 may be placed into contact with the second package component 200. In some embodiments, the corrected pads 116 of the integrated circuit component 100 is placed into physical contact with the bond pads 212 of the second package component 200 while the topmost dielectric layer of the interconnect structure 208 is placed into physical contact with the second dielectric layer 118. In some cases, the bonding process between bonding surfaces begins as the bonding surfaces physically contact each other. The corrected pads 116 are bonded to the bond pads 212 to electrically couple the integrated circuit component 100 and the second package component 200.

In some embodiments, a thermal treatment is performed after the bonding surfaces are in physical contact. The thermal treatment may strengthen the bonding between the integrated circuit component 100 and the second package component 200, in some cases. The thermal treatment may include a process temperature in the range of about 200° C. to about 400° C., though other temperatures are possible. In some embodiments, the thermal treatment includes a process temperature that is at or above a eutectic point for a material of the corrected pads 116 and/or the bond pads 212. In this manner, the integrated circuit component 100 and the second package component 200 are bonded together using dielectric-to-dielectric bonding and/or metal-to-metal bonding.

Additionally, while specific processes have been described to initiate and strengthen the bonds between the integrated circuit component 100 and the second package component 200, these descriptions are intended to be illustrative and are not intended to be limiting upon the embodiments. Rather, any suitable combination of baking, annealing, pressing, or other bonding processes or combination of processes may be utilized. All such processes are fully intended to be included within the scope of the embodiments.

Figure 14:
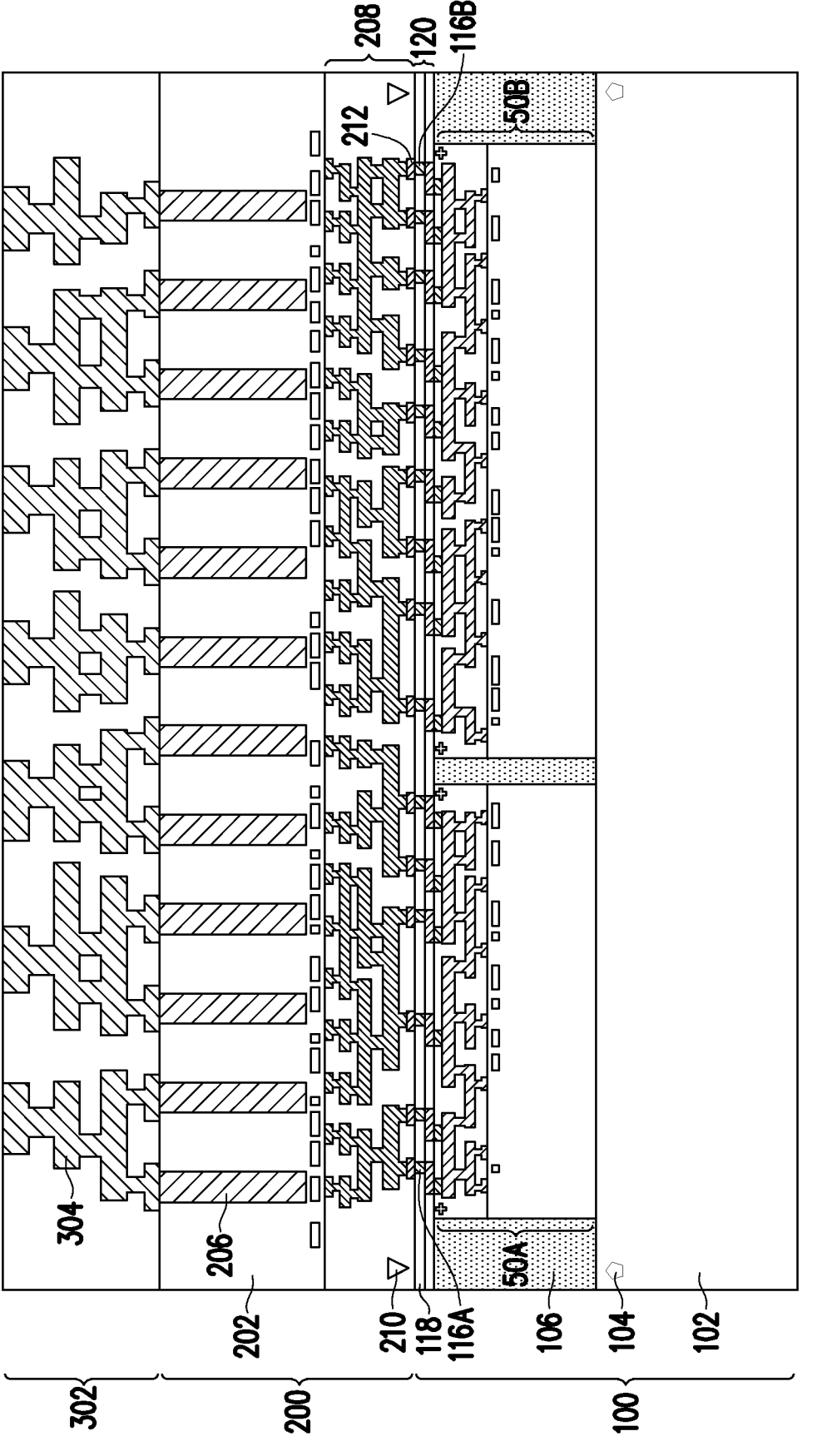

In FIG. 14, a back-side redistribution structure 302 is formed on the second package component 200, in accordance with some embodiments. In other embodiments, a back-side redistribution structure 302 is not formed. In some embodiments, before forming the back-side redistribution structure 302, a planarization process (e.g., a CMP process, a grinding process, or the like) is performed to thin the substrate 202 and expose the TSVs 206. The back-side redistribution structure 302 may then be formed over the substrate 202 and the TSVs 206, and may make electrical contact to the TSVs 206. The back-side redistribution structure 302 may comprise one or more redistribution layers 304, which may comprise conductive lines, conductive vias, metallization layers, metallization patterns, or the like. The back-side redistribution structure 302 may be formed using a suitable process, such as damascene, dual damascene, or another process. For example, in some embodiments, a passivation layer may be deposited and patterned and then a seed layer may be deposited over the patterned passivation layer. A photoresist may then be deposited and patterned over the seed layer. A redistribution layer 304 may be formed by depositing conductive material on exposed regions of the seed layer, and then removing the photoresist and underlying regions of the seed layer. This process may be repeated to form a back-side redistribution structure 302 comprising one or more redistribution layers 304. The back-side redistribution structure 302 may have a different number of layers than shown in FIG. 14, which may be formed using any suitable materials or processes.

Figure 15:
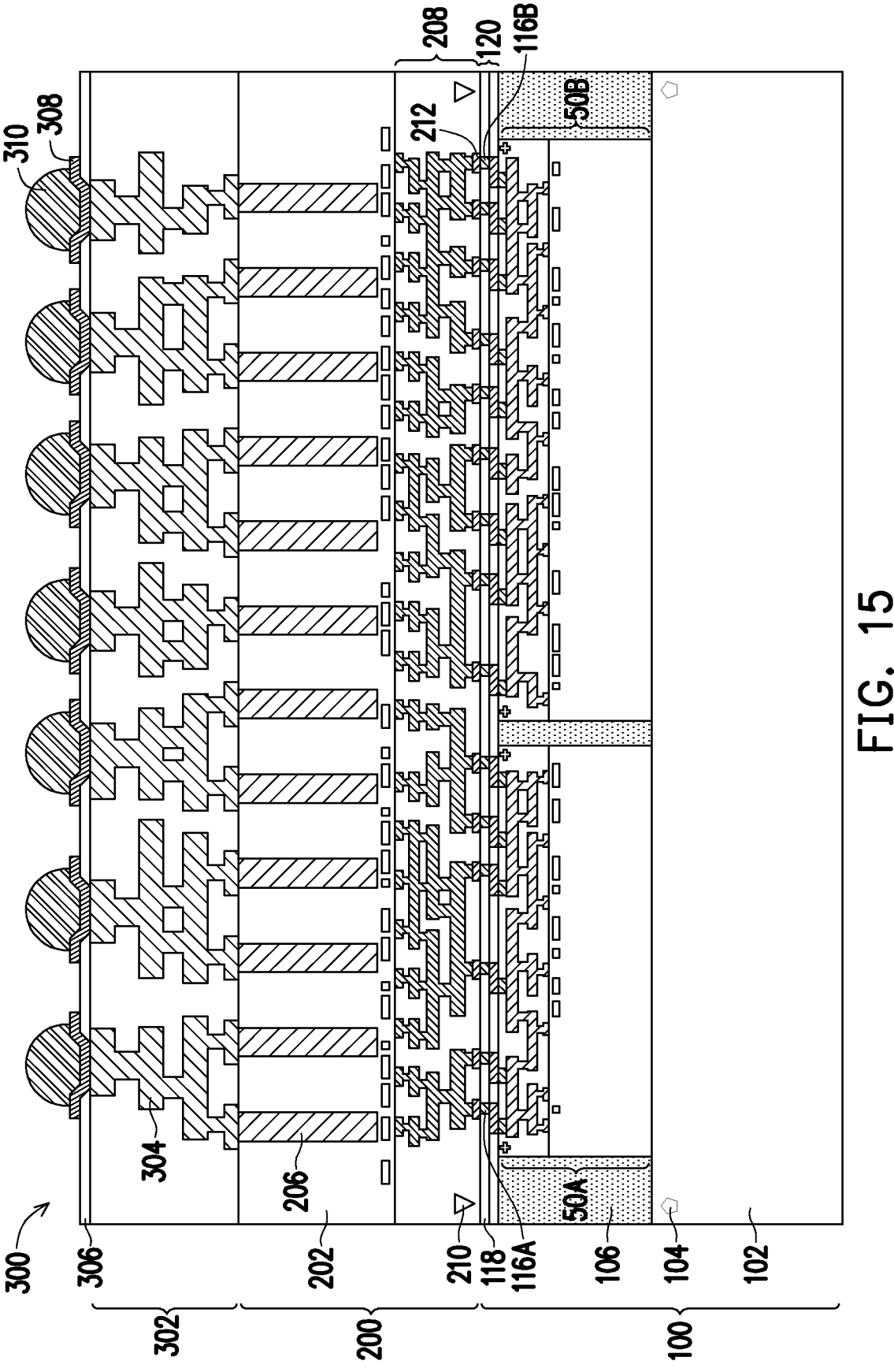

In FIG. 15, conductive connectors 310 are formed on the back-side redistribution structure 302, forming the package 300, in accordance with some embodiments. The conductive connectors 310 allow for electrical connection to external components. In some embodiments, a passivation layer 306 is formed over the back-side redistribution structure 302. The passivation layer 306 may be a dielectric material, such as polymer, silicon nitride, silicon oxide, or the like, and may be formed using any suitable techniques. In some embodiments, the passivation layer 306 is part of the back-side redistribution structure 302.

Under-bump metallizations (UBMs) 308 may be formed on the back-side redistribution structure 302, in some embodiments. The UBMs 308 may have bump portions on and extending along the major surface of the passivation layer 306, and may have via portions extending through the passivation layer 306 to physically and electrically contact the top-most redistribution layer 304 of the back-side redistribution structure 302. The UBMs 303 may be formed of the same material as the redistribution layers 304 of the back-side redistribution structure 302, though other materials or combinations of materials are possible.

Conductive connectors 310 may then be formed on the UBMs 308, in some embodiments. The conductive connectors 310 may be, for example, ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 310 may include a conductive material such as solder, copper, aluminum, gold, nickel, silver, palladium, tin, the like, or a combination thereof. In some embodiments, the conductive connectors 310 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 310 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

In other embodiments, UBMs 308 and/or conductive connectors 310 are not formed, and the back-side redistribution structure 302 of the package 300 may be directly bonded to an external component. In other embodiments, the carrier 102 is removed after forming the conductive connectors 310. In other embodiments, the carrier 102 may be removed at a prior process step, such as before bonding the integrated circuit component 100 to the second package component 200. In some embodiments, the carrier 102 is removed and replaced with a heat sink or other heat dissipating structure. In some embodiments, the carrier 102 comprises a heat sink or other heat dissipating structure, and is not removed. These and other variations for a package 300 having an adaptive interconnect structure 120 are considered within the scope of the present disclosure.

FIGS. 16 through 22 illustrate cross-sectional views of intermediate steps in the formation of a package 600 (see FIG. 22), in accordance with some embodiments. The package 600 is similar to the package 300 shown in FIG. 15, except that a first adaptive interconnect structure 120 is formed over the front sides of the integrated circuit dies 50A-B (similar to the adaptive interconnect structure 120 of the package 300) and a second adaptive interconnect structure 420 is formed over the back sides of the integrated circuit dies 50A-B. Some of the formation steps and/or features of the package 600 are similar to those of the package 300, and are not repeated.

Figure 16:
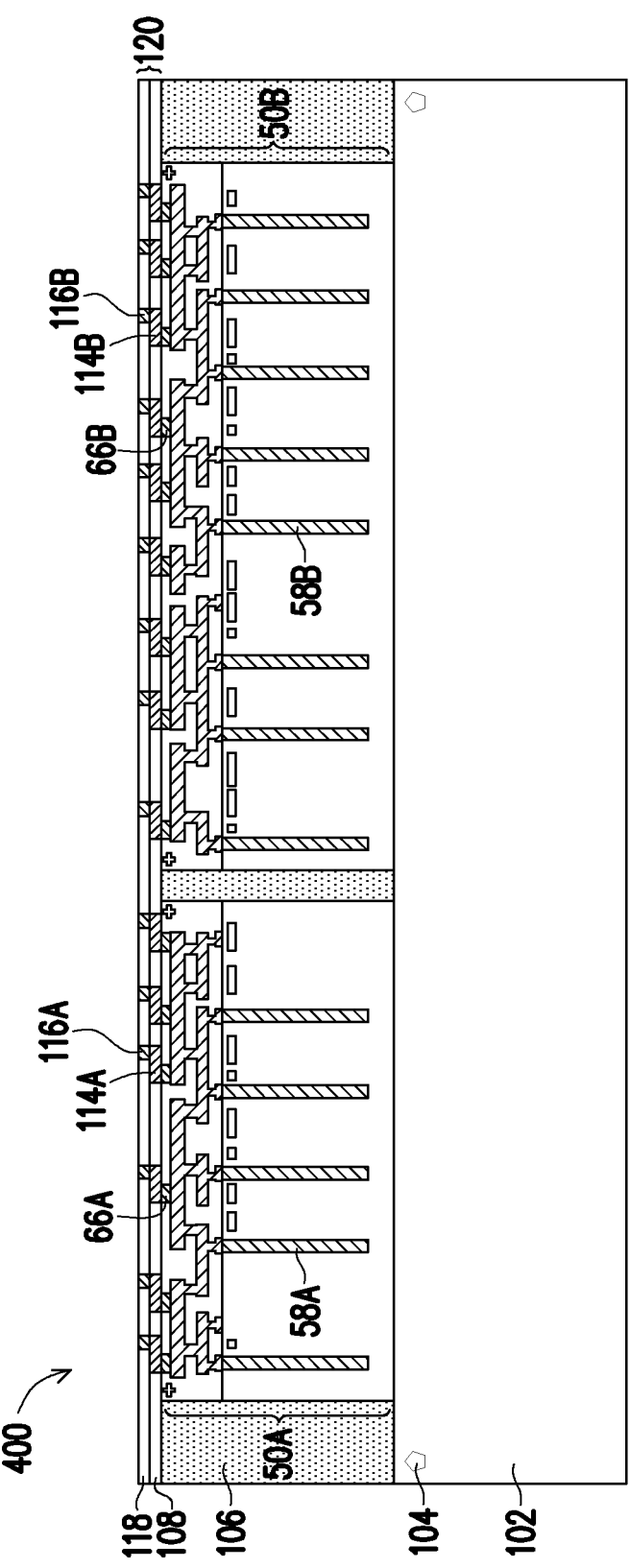
FIGS. 16, 17, 18, 19, 20, 21, and 22 illustrate cross-sectional views of intermediate steps in the formation of a package, in accordance with some embodiments.

FIG. 16 illustrates an integrated circuit component 400, in accordance with some embodiments. The integrated circuit component 400 of FIG. 16 is similar to the integrated circuit component 100 described previously for FIG. 9, except for some or all of the differences described below. Accordingly, the integrated circuit component 400 may be formed using materials or techniques similar to those described previously in FIGS. 1-9 for the integrated circuit component 100. The integrated circuit component 400 includes one or more integrated circuit dies 50, which may be similar to those described previously, except that the integrated circuit dies 50 in FIG. 16 also include through-substrate vias (TSVs) 58. For example, the integrated circuit die 50A includes TSVs 58A, and the integrated circuit die 50B includes TSVs 58B. The TSVs 58 of an integrated circuit die 50 may be electrically connected to the interconnect structure 60 of the integrated circuit die 50, and may extend into the semiconductor substrate 52 of the interconnect circuit die 50. The integrated circuit dies 50 may be encapsulated by an encapsulant 106, in some embodiments.

The integrated circuit component 400 includes a first adaptive interconnect structure 120 formed over the interconnect structures 60 of the integrated circuit dies 50. The first adaptive interconnect structure 120 may be similar to the adaptive interconnect structure 120 of the integrated circuit component 100, and may be formed using similar techniques. For example, the first adaptive interconnect structure 120 of the integrated circuit component 400 may include adaptive lines 114 in a first dielectric layer 108 and corrected pads 116 in a second dielectric layer 118. The adaptive lines 114 electrically connect the corrected pads 116 to corresponding pads 66 of the integrated circuit dies 50. The adaptive lines 114 and the corrected pads 116 may be formed, for example, by determining a pattern, adaptively patterning the pattern into a photoresist using a programmable lithography tool or the like, using the patterned photoresist as an etching mask to etch openings in an underlying dielectric layer, and then filling the openings with a conductive material.

Figure 17:
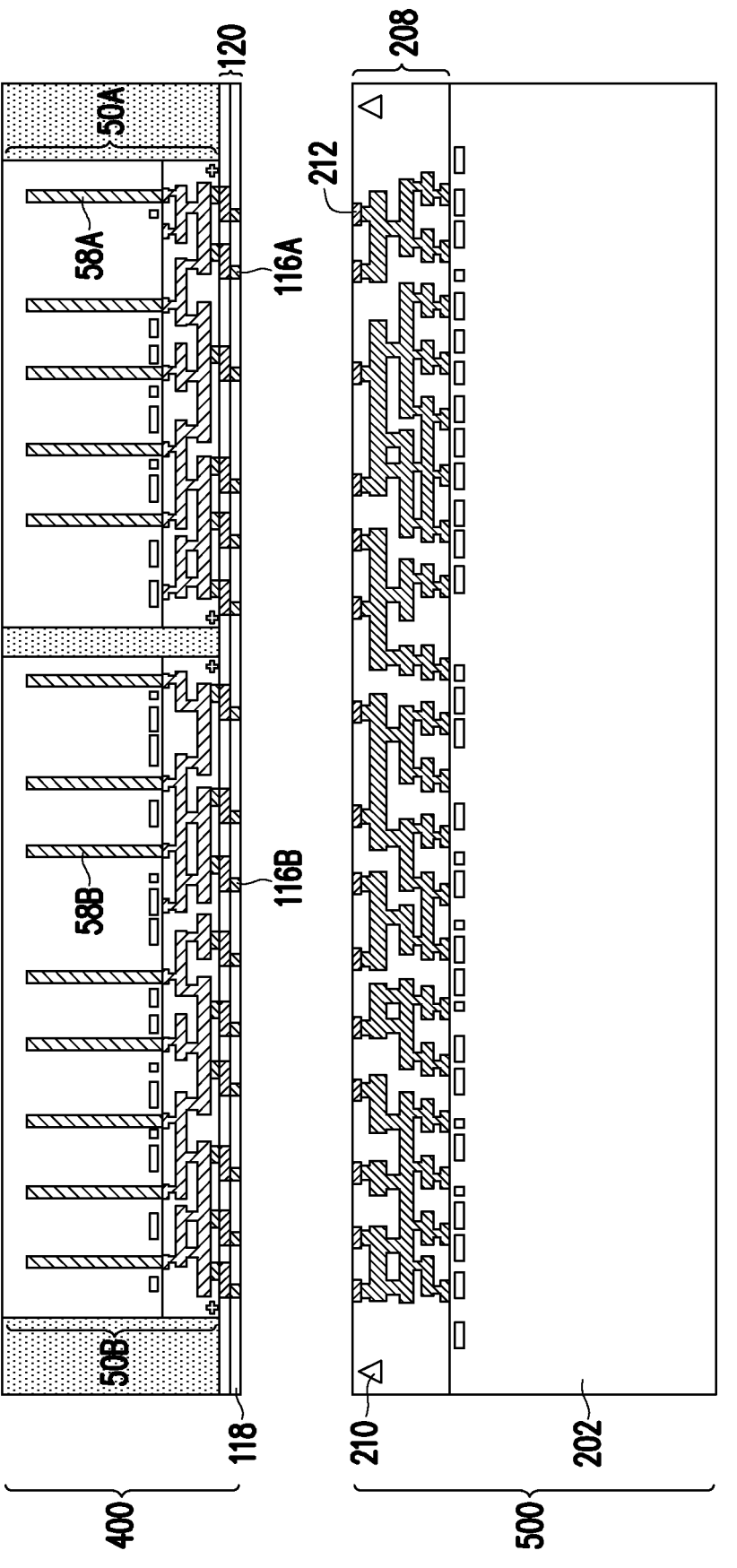

FIG. 16 illustrates an integrated circuit component 400 and a second package component 500 and prior to bonding, in accordance with some embodiments. The integrated circuit component 400 and the second package component 500 are subsequently bonded to form a package 600 (see FIG. 22). In some embodiments, the carrier 102 may be removed prior to bonding the integrated circuit component 400 and the second package component 500. The second package component 500 is similar to the second package component 200 described previously (see FIG. 11), except that in some embodiments the second package component 500 may not include TSVs 206. For example, the second package component 500 may include a substrate 202, an interconnect structure 208 formed on the substrate 202, and bond pads 212 formed in the interconnect structure 208, in some embodiments. The second package component 500 shown in FIG. 17 is an example, and other types of components or structures may be bonded to the integrated circuit component 400 in other embodiments.

Figure 18:
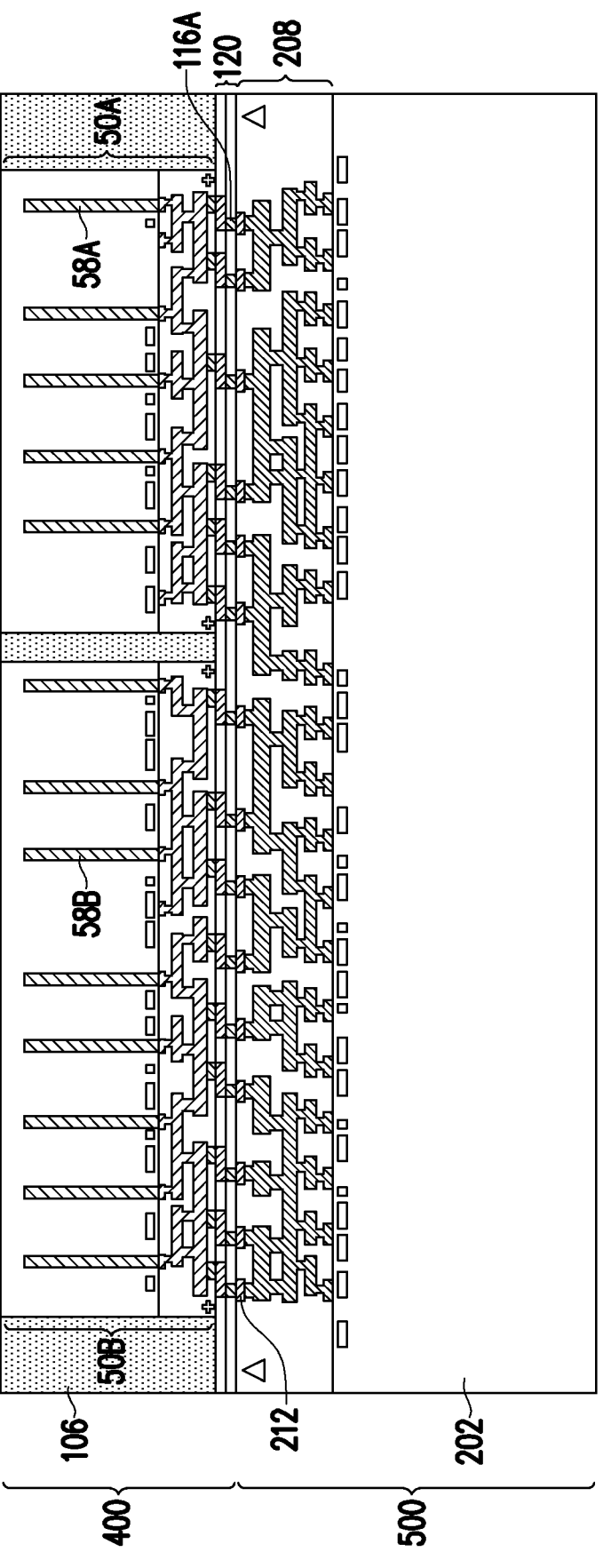

In FIG. 18, the integrated circuit component 400 and the second package component 500 are bonded together, in accordance with some embodiments. In some embodiments, the integrated circuit component 400 is bonded to the second package component 500 using, for example, dielectric-to-dielectric bonding, metal-to-metal bonding, or a combination thereof (e.g., "hybrid bonding"). For example, the corrected pads 116 of the integrated circuit component 400 may be directly bonded to the bond pads 212 of the second package component 500 to electrically connect the integrated circuit component 400 and the second package component 500. The bonding process may be similar to the bonding process described previously for FIG. 12. For example, the bonding process may include an activation process and/or a thermal treatment.

US 12,653,010 B2

13

14

Figure 19:
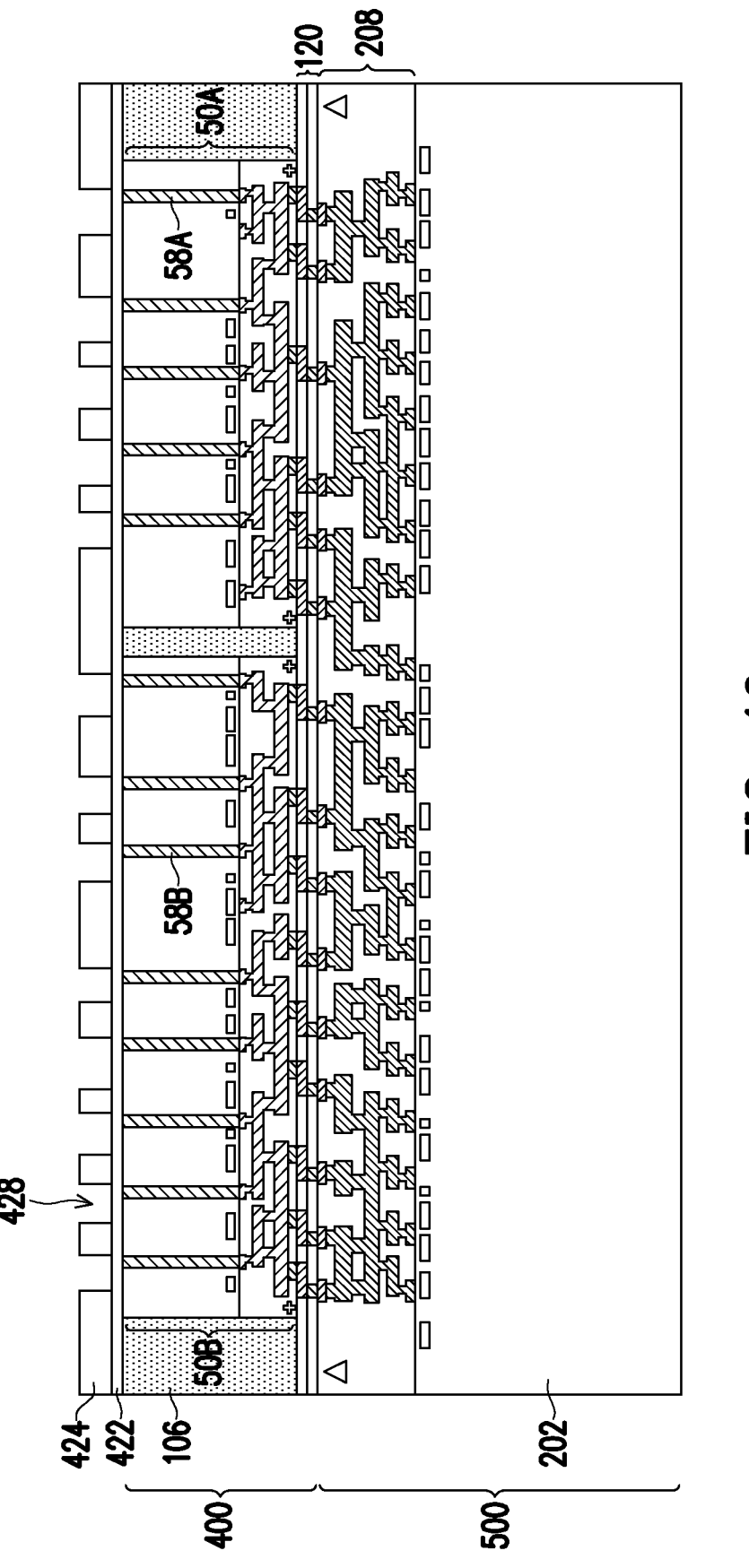
Figure 20:
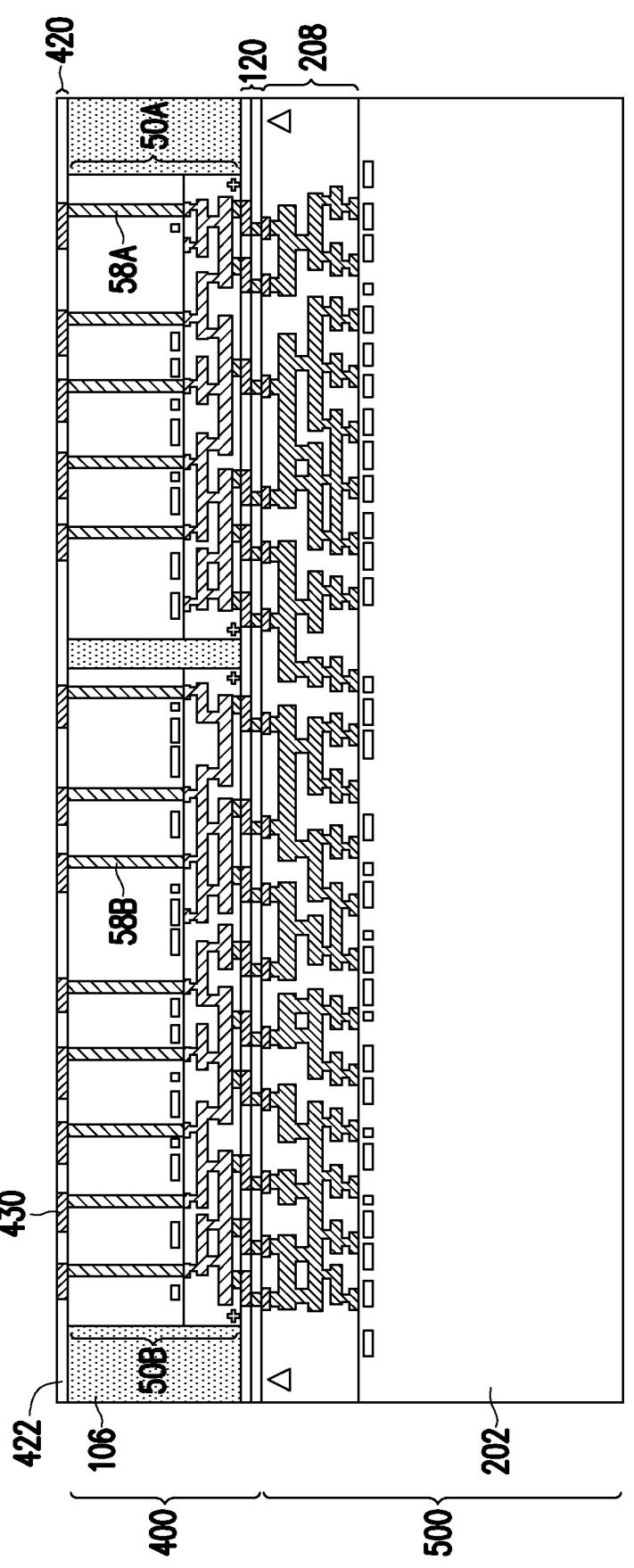

FIGS. 19 and 20 illustrate intermediate steps in the formation of a second adaptive interconnect structure 420 on the integrated circuit component 400, in accordance with some embodiments. The adaptive interconnect structure 120 may be formed, for example, to correct any lateral offset of the TSVs 58. For example, the second adaptive interconnect structure 420 may comprise adaptive lines 430 (see FIG. 20) that make electrical connections between the TSVs 58 and an overlying structure, such as the back-side redistribution structure 602 (see FIG. 21) or another component. The adaptive lines 426 may extend from the TSVs 58 to locations that have less lateral offset than the TSVs 58, and thus the adaptive lines 426 may allow for better quality bonding and better electrical coupling to subsequently-formed or subsequently-bonded structures. The second adaptive interconnect structure 420 may be formed using techniques similar to those used for the first adaptive interconnect structure 120. In some embodiments, a planarization process (e.g., a CMP process, a grinding process, or the like) is performed to thin the back sides of the integrated circuit dies 50 and expose the TSVs 58. After performing the planarization process, top surfaces of the encapsulant 106, the semiconductor substrates 52 of the integrated circuit dies 50, and the TSVs 58 of the integrated circuit dies 50 may be substantially level or coplanar.

In FIG. 19, a dielectric layer 422 and a patterned photoresist 424 is formed, in accordance with some embodiments. The first dielectric layer 422 may cover top surfaces of the encapsulant 106 and the integrated circuit dies 50A-B. The dielectric layer 422 may be formed using materials or techniques that are similar to those described previously for the first dielectric layer 108 or the second dielectric layer 118, in some embodiments. A photoresist 424 is then formed on the dielectric layer 422, and may be formed using materials or techniques that are similar to the photoresist 110 described previously. Openings 428 may then be patterned in the photoresist 422 that correspond to the subsequently formed adaptive lines 430 (see FIG. 20). The openings 428 may be formed, for example, by determining a pattern and adaptively patterning the pattern into the photoresist 424 using a programmable lithography tool or the like.

In FIG. 20, adaptive lines 430 are formed in the dielectric layer 422, in accordance with some embodiments. The adaptive lines 430 may be formed by etching the dielectric layer 422 using the patterned photoresist 424 as an etching mask. In this manner, the openings 428 are extended through the dielectric layer 422 to expose the TSVs 58. The dielectric layer 422 may be etched using a suitable wet etching process and/or dry etching process. The photoresist 424 may be removed using a suitable process such as an ashing process. Conductive material may then be deposited on the dielectric layer 422 and within the openings 428 in the dielectric layer 422. The conductive material may be similar to the material(s) of the first interconnect structure 120 and may be formed using similar techniques. A planarization process (e.g., a CMP process or a grinding process) may be performed to remove excess conductive material and form the adaptive lines 430 of the second adaptive interconnect structure 420. Forming a second adaptive interconnect structure 420 may improve process flexibility and allow for improved connections to the TSVs 58.

Figure 21:
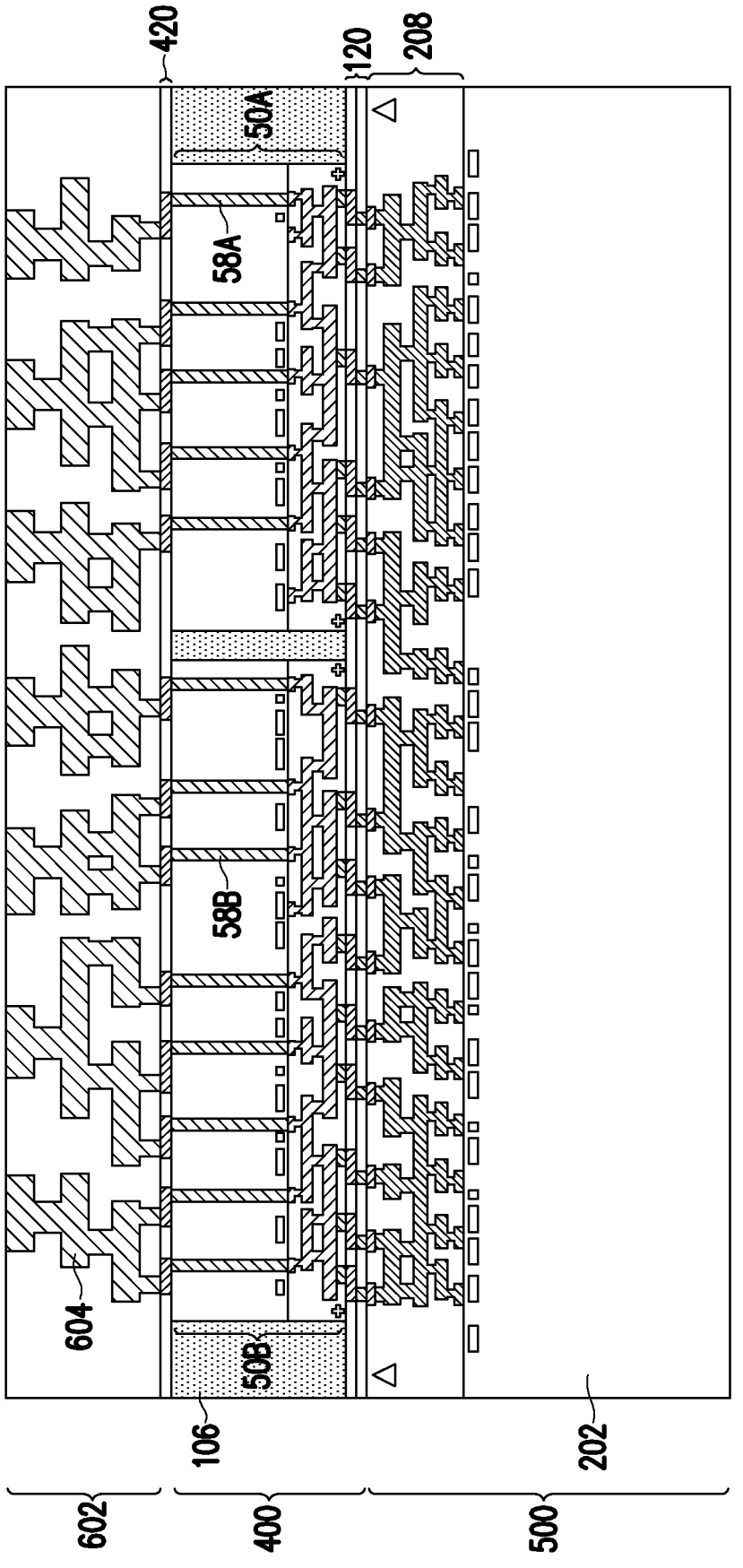

In FIG. 21, a back-side redistribution structure 602 is formed on the second adaptive interconnect structure 420, in accordance with some embodiments. In other embodiments, a package component or the like may be formed and bonded to the adaptive interconnect structure 420. In other embodiments, a back-side redistribution structure 602 is not formed.

The back-side redistribution structure 602 may be similar to the back-side redistribution structure 302, and may be formed using similar techniques. For example, the back-side redistribution structure 602 may comprise one or more redistribution layers 604, and may be formed using damascene, dual damascene, or another process. The back-side redistribution structure 602 is electrically coupled to the TSVs 58 of the integrated circuit dies 50 through the second adaptive interconnect structure 420.

Figure 22:
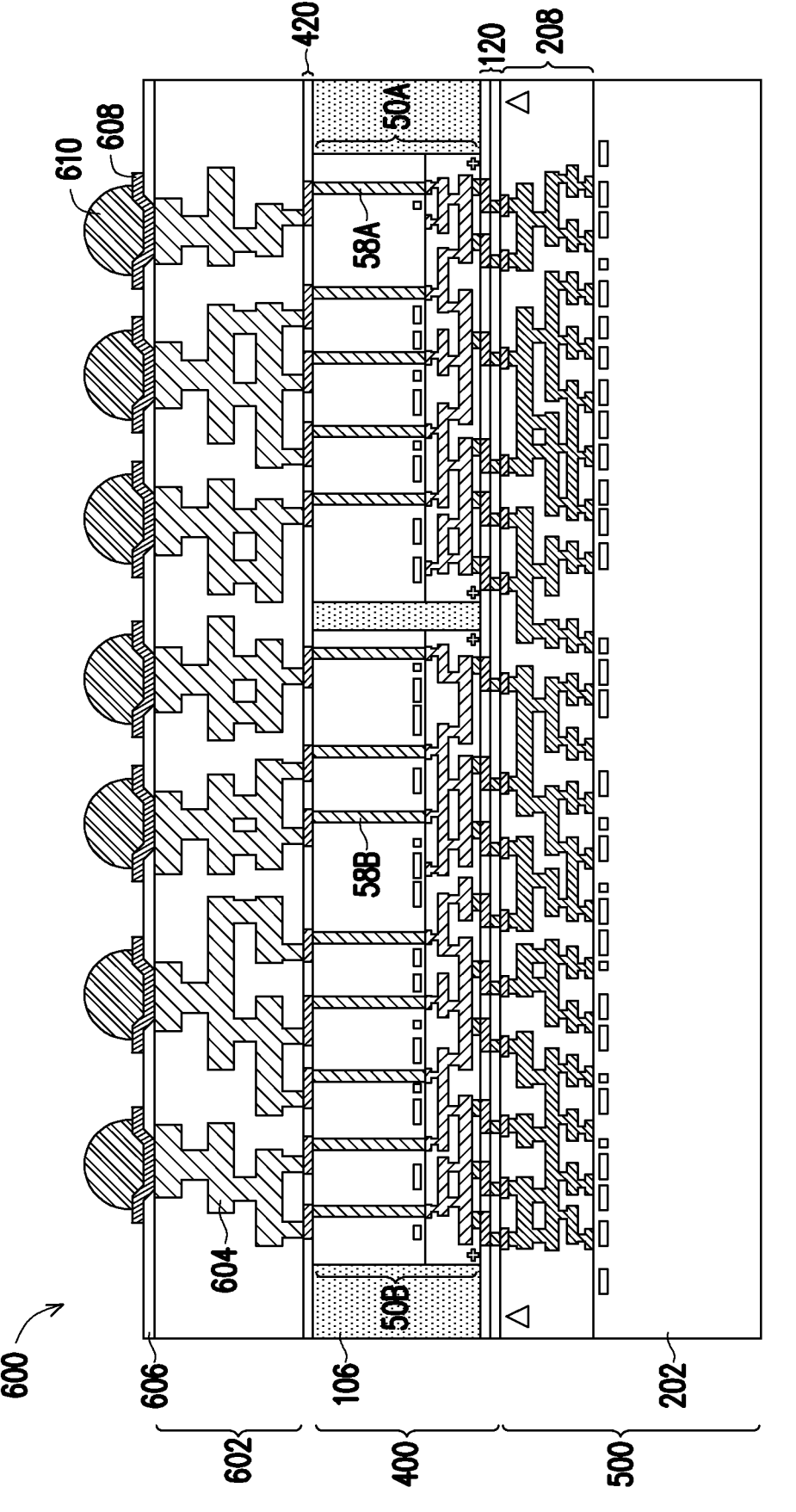

In FIG. 22, conductive connectors 610 are formed on the back-side redistribution structure 602, forming the package 600, in accordance with some embodiments. In some embodiments, a passivation layer 606 is formed over the back-side redistribution structure 602, which may be similar to the passivation layer 306 described previously. In some embodiments, under-bump metallizations (UBMs) 608 may be formed on the back-side redistribution structure 602, which may be similar to the UBMs 308 described previously. Conductive connectors 610 may be formed on the UBMs 608, which may be similar to the conductive connectors 310 described previously. The conductive connectors 610 allow for electrical connection to external components. In other embodiments, UBMs 608 and/or conductive connectors 610 are not formed. In some embodiments, the substrate 202 of the second package component 500 is thinned using a planarization process, such as a CMP process or a grinding process.

Figure 23:
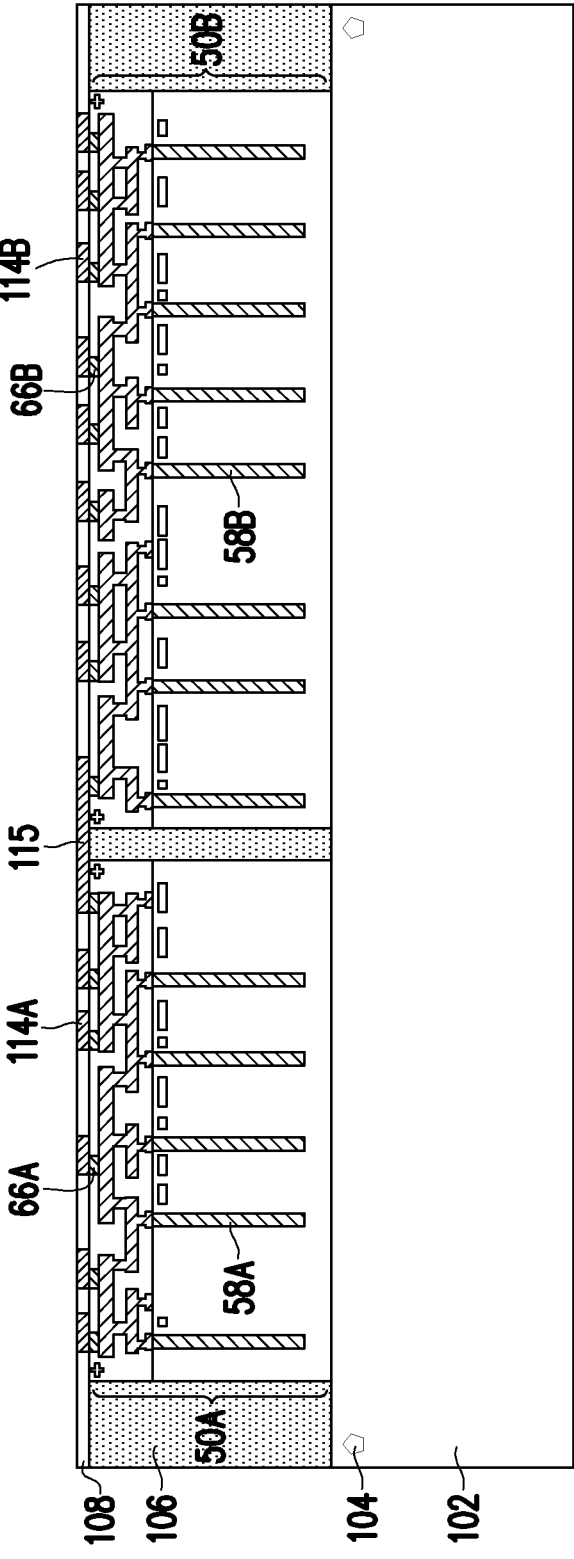
FIGS. 23, 24, and 25 illustrate cross-sectional views and top-down views of intermediate steps in the formation of a package, in accordance with some embodiments.
Figure 24:
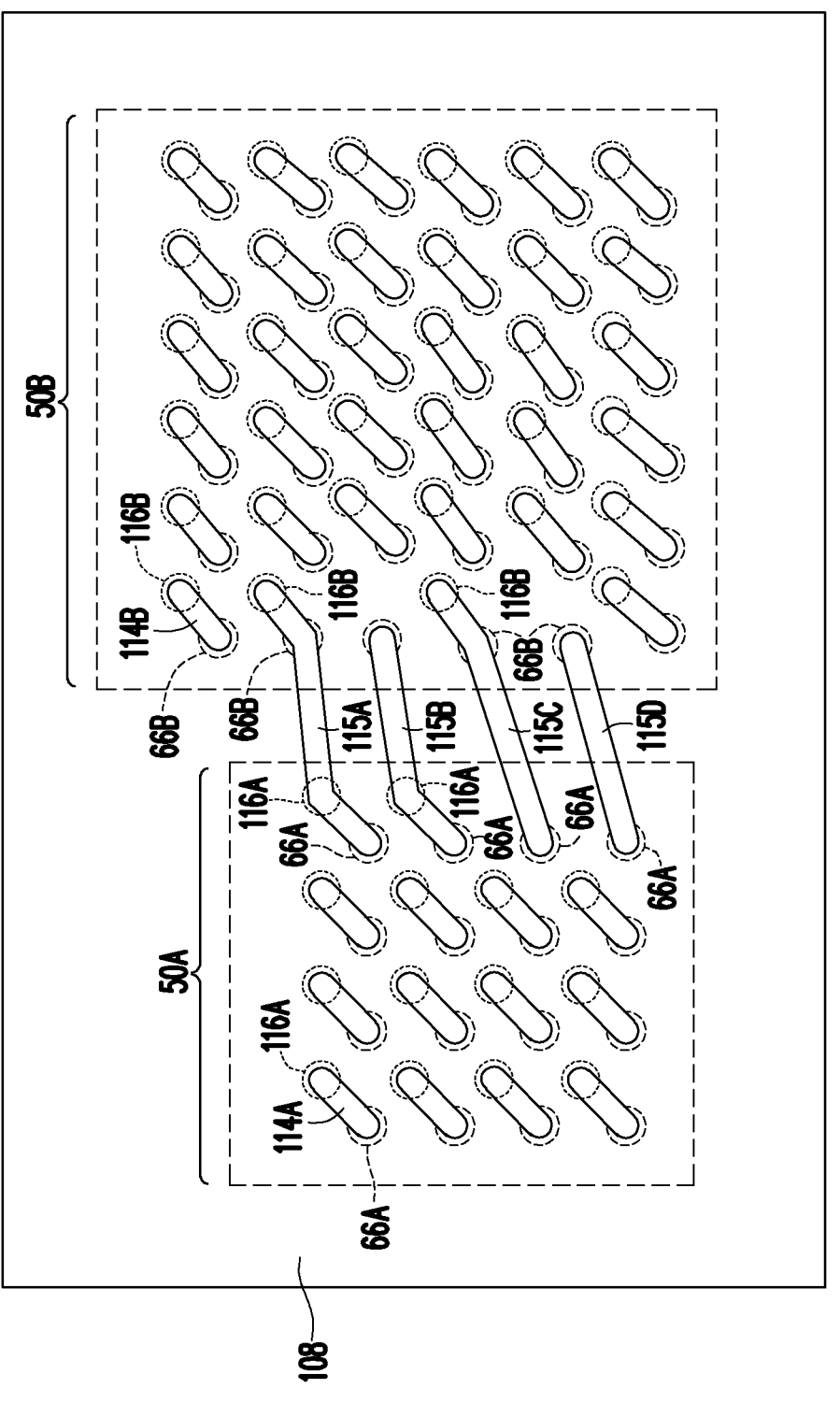
Figure 25:
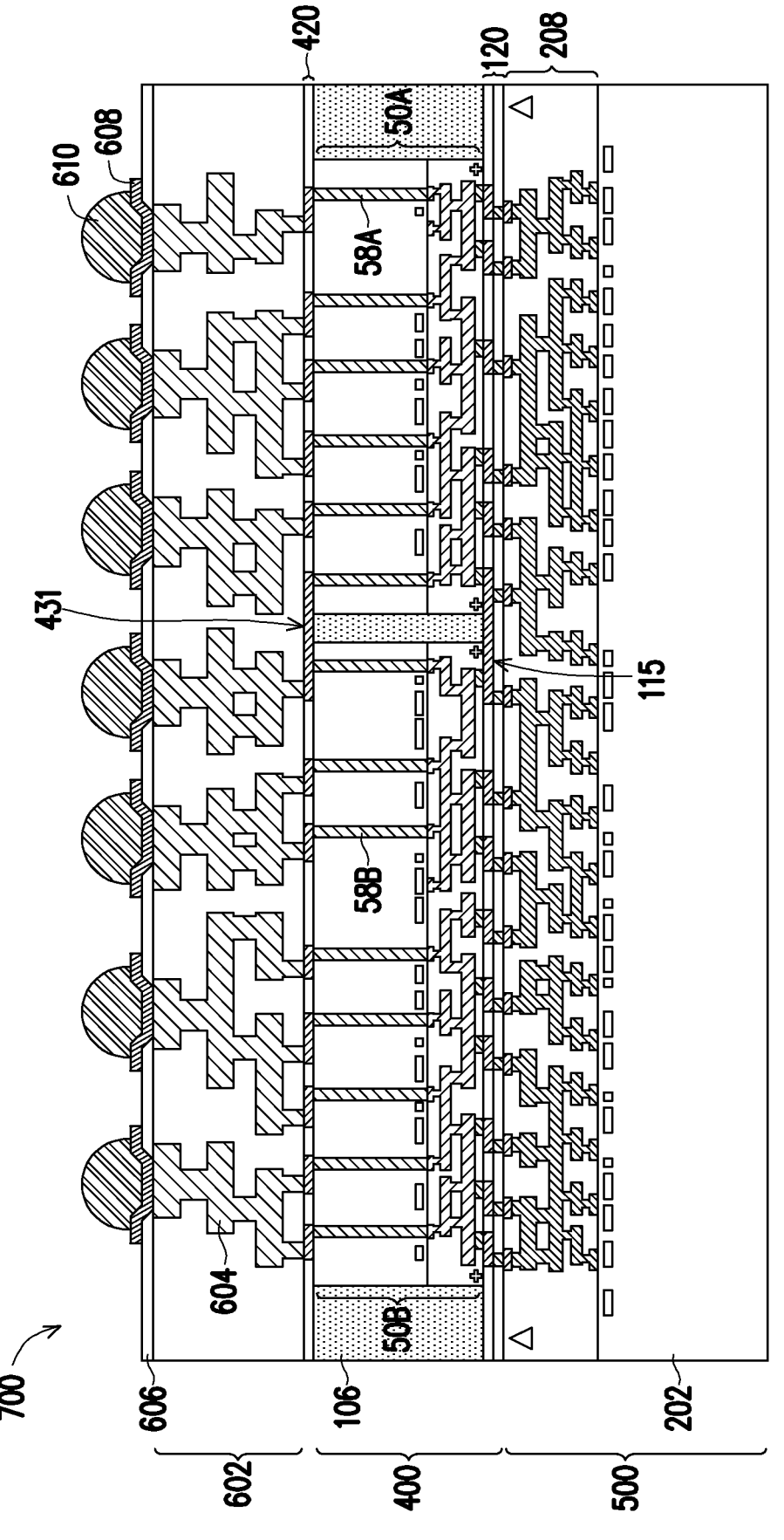

FIGS. 23, 24, and 25 illustrate intermediate steps in the formation of a package 700 (see FIG. 25), in accordance with some embodiments. The package 700 is similar to the package 600 of FIG. 22, except that the first adaptive interconnect structure 120 includes connecting lines 115 that connect pads 66A of the integrated circuit die 50A to pads 66B of the integrated circuit die 50B, and the second adaptive interconnect structure 420 includes connecting lines 431 (see FIG. 25) that connect TSVs 58A of the integrated circuit die 50A to TSVs 58B of the integrated circuit die 50B. Connecting lines 115 or 143 may be formed to connect more than two integrated circuit dies 50 in other embodiments. In other embodiments, one of the first adaptive interconnect structure 120 or the second adaptive interconnect structure 420 is not present. In other embodiments, the connecting lines 115 and/or the connecting lines 431 are not present. Forming connecting lines 115 or 143 as described herein can allow for additional interconnections to be formed within a package, which can allow for a more flexible layout and for interconnections of shorter lengths.

FIG. 23 illustrates the formation of adaptive lines 114 and connecting lines 115 of the first adaptive interconnect structure 120, in accordance with some embodiments. The connecting lines 115 may be formed along with the adaptive lines 114 using techniques similar to those described in FIGS. 3-7. For example, openings corresponding to the connecting lines 115 may be adaptively patterned in a photoresist (e.g., the photoresist 110) using a programmable lithography tool or the like. The pattern of the openings may be etched into the first dielectric layer 108 using the patterned photoresist as an etching mask. The openings corresponding to the connecting lines 115 may expose pads 66 of multiple integrated circuit dies 50. For example, an opening may extend from a pad 66A of the integrated circuit die 50A to a pad 66B of the integrated circuit die 50B. Conductive material may then be deposited into the openings, forming the adaptive lines 114 and the connecting lines 115.

FIG. 24 illustrates a top-down view after the formation of the adaptive lines 114 and the connecting lines 115, in accordance with some embodiments. The structure shown in FIG. 24 is an illustrative example, and other configurations or arrangements are possible in other embodiments. As shown in FIG. 24, adaptive lines 114A are formed over pads 66A of the integrated circuit die 50A and adaptive lines 114B are formed over pads 66B of the integrated circuit die 50B. Additionally, a plurality of connecting lines 115A-D are formed extending from pads 66A of the integrated circuit die 50A to pads 66B of the integrated circuit die 50B, which electrically couples the integrated circuit dies 50A-B. Connecting line 115A extends from a pad 66A to a pad 66B, but also extends into locations where corrected pads 116A and 116B are subsequently formed. Connecting line 115B extends from a pad 66A to a pad 66B, but extends only into a location where a corrected pad 116A is subsequently formed. Connecting line 115C extends from a pad 66A to a pad 66B, but extends only into a location where a corrected pad 116B is subsequently formed. Connecting line 115D extends from a pad 66A to a pad 66B, but no corrected pads 116 are subsequently formed over connecting line 115D. The connecting lines 115A-D shown in FIG. 24 are illustrative examples, and other configurations, arrangements, numbers, or combinations of connecting lines 115 are possible.

FIG. 25 illustrates a package 700 formed after subsequently processing the structure of FIG. 24, in accordance with some embodiments. The package 700 may be formed using process steps similar to those described previously in FIGS. 16-22 for the package 600. For example, corrected pads 116 may be formed to form the first adaptive interconnect structure 120 of an integrated circuit component 400, and a second package component 500 may be bonded to the first adaptive interconnect structure 120.

Similar to the package 600, the package 700 may include a second adaptive interconnect structure 420 formed over the back side of the integrated circuit component 400. The second adaptive interconnect structure 420 of FIG. 25 may be similar to the second adaptive interconnect structure 420 described previously for FIGS. 19-20, except for the presence of connecting lines 431. The connecting lines 431 may extend over and electrically couple TSVs 58 of different integrated circuit dies 50, in some embodiments. In some embodiments, one or more connecting lines 431 are electrically connected to one or more TSVs 58 and to the overlying back-side redistribution structure 602. In some embodiments, one or more connecting lines 431 are not formed over and electrically connected to TSVs 58, but are electrically connected to the overlying back-side redistribution structure 602. The connecting lines 431 may be formed along with the adaptive lines 430. Forming connecting lines 431 in this manner may improve process flexibility or design flexibility, and may allow for improved interconnection between features.

In some embodiments, a back-side redistribution structure 602 may be formed over the second adaptive interconnect structure 420, which may be similar to the back-side redistribution structure 602 described for FIG. 21. The redistribution layers 604 of the back-side redistribution structure 602 may physically and electrically contact the adaptive lines 430 and/or the connecting lines 431 of the second adaptive interconnect structure 420. In some embodiments, a passivation layer 606, UBMs 608, and/or conductive connectors 610 may be formed, which may be similar to those described previously. The package 700 is an example, and other configurations or variations are possible.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or the 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments may achieve advantages. By forming an adaptive interconnect structure as described herein more precise bonding alignment may be achieved. Lateral offsets or misalignments may be compensated for, which can improve bonding, device performance, device reliability, and yield. The use of adaptive patterning techniques allow for corrected bonding pads to be formed without the use of costly photomasks or the like. In some cases, the adaptive interconnect structure may be used to compensate for design errors or process errors without the use of costly photomasks. The formation of the adaptive interconnect structure may utilize programmable photolithography tools and techniques, and thus pattern of the adaptive interconnect structure may be determined on a per-device basis or may be determined based on historical data or process data. In this manner, the manufacturing of a package may be adjusted without additional processing steps. Additionally, connections between adjacent devices such as integrated circuit dies may be formed within the adaptive interconnect structure.

In accordance with some embodiments of the present disclosure, a method includes forming a first adaptive interconnect structure on a first side of a first semiconductor device, including determining a first lateral offset between a first lateral location of a first conductive pad of the first semiconductor device and a second lateral location, wherein the second lateral location corresponds to a location of a bond pad of a package component; based on the first lateral offset, forming a first conductive line on the first conductive pad, wherein the first conductive line extends from the first lateral location to the second lateral location; and forming a second conductive pad on the first conductive line, wherein the second conductive pad is at the second lateral location; and bonding the second conductive pad to the bond pad. In an embodiment, the determining of the first lateral offset is performed after attaching the first semiconductor device to a carrier. In an embodiment, the method includes forming a second adaptive interconnect structure on a back side of a first semiconductor device, including determining a second lateral offset between a third lateral location of a first through-substrate via of the first semiconductor device and a fourth lateral location, wherein the fourth lateral location corresponds to a location of a conductive feature of a back-side redistribution structure; and based on the second lateral offset, forming a second conductive line on the first through-substrate via, wherein the second conductive line extends from the third lateral location to the fourth lateral location. In an embodiment, the second conductive line physically and electrically connects the first through-substrate via of the first semiconductor device and a second through-substrate via of a second semiconductor device. In an embodiment, the method includes forming a back-side redistribution structure over the back side of the first semiconductor device, wherein the back-side redistribution structure is electrically connected to the second conductive line. In an embodiment, the method includes forming the first adaptive interconnect structure on a first side of a third semiconductor device, wherein the first adaptive interconnect structure includes a third conductive line extending from a fifth lateral location of a third conductive pad of the first semiconductor device to a sixth lateral location of a fourth conductive pad of the third semiconductor device. In an embodiment, forming the first conductive line includes using a programmable photolithographic tool to form an opening in a mask corresponding to the first conductive line. In an embodiment, the programmable photolithographic tool is a laser writing system. In an embodiment, the package component includes through substrate vias, and the method includes forming a redistribution structure over and electrically connected to the through substrate vias.

In accordance with some embodiments of the present disclosure, a method includes attaching integrated circuit dies to a carrier, wherein each integrated conductive die includes conductive pads at a top surface of that integrated circuit die; determining a lateral offset for each conductive pad of each of the integrated circuit dies, wherein each lateral offset represents a difference between a measured location of the respective conductive pad and a desired location of the respective conductive pad; forming a first dielectric layer over the integrated circuit dies; patterning first openings in the first dielectric layer, wherein the pattern for each of the first openings is determined from the measured location, the lateral offset, and the desired location of a corresponding conductive pad; depositing a first conductive material in the first openings; forming a second dielectric layer over the first dielectric layer; patterning second openings in the second dielectric layer, wherein the pattern for each of the second openings is determined from the desired location of a corresponding conductive pad; and depositing a second conductive material in the second openings to form first bonding pads. In an embodiment, the method includes directly bonding a package component to the first bonding pads. In an embodiment, the package component includes second bonding pads, wherein the location of each second bonding pad corresponds to the desired location of a conductive pad. In an embodiment, directly bonding a package component to the first bonding pads includes bonding each first bonding pad to a corresponding second bonding pad using metal-to-metal bonding. In an embodiment, patterning the first openings includes depositing a photoresist over the first dielectric layer; using a programmable photolithography tool to pattern the photoresist; and etching the first dielectric layer using the patterned photoresist as an etching mask. In an embodiment, the programmable photolithography tool is a maskless photolithography system. In an embodiment, the method includes patterning third openings in the first dielectric layer, wherein the pattern for each of the third openings is determined from the measured location of a conductive pad of a first integrated circuit die of the integrated circuit dies and from the measured location of a conductive pad of a second integrated circuit die of the integrated circuit dies; and depositing the first conductive material in the third openings.

In accordance with some embodiments of the present disclosure, a package includes a first package component including a semiconductor die, wherein the semiconductor die includes conductive pads, wherein the semiconductor die is surrounded by an encapsulant; an adaptive interconnect structure on the semiconductor die, wherein the adaptive interconnect structure includes conductive lines, wherein each conductive line physically and electrically contacts a respective conductive pad; and first bond pads, wherein each first bond pad physically and electrically contacts a respective conductive line; and a second package component including an interconnect structure, wherein the interconnect structure includes second bond pads, wherein each second bond pad is directly bonded to a respective first bond pad, wherein each second bond pad is laterally offset from a corresponding conductive pad which is electrically coupled to that second bond pad. In an embodiment, the conductive lines are formed in a first dielectric layer, wherein the first dielectric layer extends over the semiconductor die and over the encapsulant. In an embodiment, the first bond pads are formed in a second dielectric layer, wherein the second dielectric layer extends over the semiconductor die and over the encapsulant. In an embodiment, each second bond pad has the same lateral offset from its corresponding conductive pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:

attaching a first semiconductor device to a first side of a carrier, wherein the first semiconductor device comprises a first conductive pad on a first side of the first semiconductor device, wherein a first surface of the first conductive pad is exposed;

forming a first adaptive interconnect structure on the first side of the first semiconductor device, comprising:

determining a first lateral offset between a first lateral location of the first conductive pad of the first semiconductor device and a second lateral location, wherein the second lateral location corresponds to a location of a bond pad of a package component;

based on the first lateral offset, forming a first conductive line on the first surface of the first conductive pad, wherein the first conductive line extends from the first lateral location to the second lateral location; and forming a second conductive pad on a first surface of the first conductive line, wherein the second conductive pad is at the second lateral location, wherein the first conductive line directly contacts the first conductive pad and the second conductive pad; and bonding the second conductive pad to the bond pad.

2. The method of claim 1, wherein the determining of the first lateral offset is performed after attaching the first semiconductor device to the carrier.

3. The method of claim 1 further comprising:

forming a second adaptive interconnect structure on a back side of the first semiconductor device, comprising:

determining a second lateral offset between a third lateral location of a first through-substrate via of the first semiconductor device and a fourth lateral location, wherein the fourth lateral location corresponds to a location of a conductive feature of a back-side redistribution structure; and based on the second lateral offset, forming a second conductive line on the first through-substrate via, wherein the second conductive line extends from the third lateral location to the fourth lateral location.

4. The method of claim 3, wherein the second conductive line physically and electrically connects the first through-substrate via of the first semiconductor device and a second through-substrate via of a second semiconductor device.

5. The method of claim 3 further comprising forming a back-side redistribution structure over the back side of the first semiconductor device, wherein the back-side redistribution structure is electrically connected to the second conductive line.

6. The method of claim 1 further comprising forming the first adaptive interconnect structure on a first side of a third semiconductor device, wherein the first adaptive interconnect structure comprises a third conductive line extending from a fifth lateral location of a third conductive pad of the first semiconductor device to a sixth lateral location of a fourth conductive pad of the third semiconductor device.

7. The method of claim 1, wherein forming the first conductive line comprises using a programmable photolithographic tool to form an opening in a mask corresponding to the first conductive line.

8. The method of claim 7, wherein the programmable photolithographic tool is a laser writing system.

9. The method of claim 1, wherein the package component comprises through substrate vias, and further comprising forming a redistribution structure over and electrically connected to the through substrate vias.

10. A method comprising:

attaching a plurality of integrated circuit dies to a carrier, wherein each integrated conductive die comprises a plurality of conductive pads at a top surface of that integrated circuit die;

measuring a location of each conductive pad of each of the plurality of integrated circuit dies;

determining a lateral offset for each conductive pad of each of the plurality of integrated circuit dies, wherein each lateral offset represents a difference between the measured location of a respective conductive pad of the plurality of conductive pads and a desired location of the respective conductive pad of the plurality of conductive pads;

forming a first dielectric layer over the plurality of integrated circuit dies;

patterning a plurality of first openings in the first dielectric layer, wherein the pattern for each of the first openings is based on the measured location, the lateral offset, and the desired location of a respective conductive pad of the plurality of conductive pads;

depositing a first conductive material in the plurality of first openings, wherein top surfaces of the first conductive material and the first dielectric layer are level;

forming a second dielectric layer over the first dielectric layer;

patterning a plurality of second openings in the second dielectric layer, wherein the pattern for each of the second openings is based on the desired location of a respective conductive pad of the plurality of conductive pads; and depositing a second conductive material in the plurality of second openings to form a plurality of first bonding pads, wherein top surfaces of the plurality of first bonding pads and the second dielectric layer are level.

11. The method of claim 10 further comprising directly bonding a package component to the plurality of first bonding pads.

12. The method of claim 11, wherein the package component comprises a plurality of second bonding pads, wherein the location of each second bonding pad corresponds to a desired location of a respective conductive pad of the plurality of conductive pads.

13. The method of claim 11, wherein directly bonding a package component to the plurality of first bonding pads comprises bonding each first bonding pad to a corresponding second bonding pad using metal-to-metal bonding.

14. The method of claim 10, wherein patterning the plurality of first openings comprises:

depositing a photoresist over the first dielectric layer;

using a programmable photolithography tool to pattern the photoresist; and etching the first dielectric layer using the patterned photoresist as an etching mask.

15. The method of claim 14, wherein the programmable photolithography tool is a maskless photolithography system.

16. The method of claim 10 further comprising:

patterning a plurality of third openings in the first dielectric layer, wherein the pattern for each of the third openings is determined from the measured location of a conductive pad of a first integrated circuit die of the plurality of integrated circuit dies and from the measured location of a conductive pad of a second integrated circuit die of the plurality of integrated circuit dies; and depositing the first conductive material in the plurality of third openings.

17. A method comprising:

forming an adaptive interconnect structure on a first package component, wherein the first package component comprises a semiconductor die, wherein the semiconductor die comprises a plurality of conductive pads, wherein forming the adaptive interconnect structure comprises:

forming a plurality of conductive lines over the semiconductor die, wherein each conductive line physically and electrically contacts a corresponding conductive pad of the semiconductor die;

forming a bonding layer over the conductive lines, wherein a width of the bonding layer is greater than a width of the semiconductor die; and forming a plurality of first bond pads in the bonding layer and over the conductive lines, wherein each first bond pad physically and electrically contacts a corresponding conductive line, wherein each conductive line connects a corresponding first bond pad to a corresponding conductive pad, wherein each first bond pad is laterally offset from its corresponding conductive pad; and bonding a second package component to the bonding layer of the adaptive interconnect structure using a dielectric-to-dielectric bonding process, wherein the second package component comprises second bond pads, wherein the bonding comprises directly bonding each second bond pad to a corresponding first bond pad.

18. The method of claim 17 further comprising:

forming an encapsulant surrounding the semiconductor die; and forming a first dielectric layer extending over the semiconductor die and over the encapsulant, wherein the conductive lines are formed in the first dielectric layer.

19. The method of claim 17, wherein each first bond pad has the same lateral offset from its corresponding conductive pad.

20. The method of claim 1, wherein the first adaptive interconnect structure has a width greater than a width of the first semiconductor device.

\* \* \* \* \*